United States Patent
Cox

(10) Patent No.: US 6,273,956 B1
(45) Date of Patent: Aug. 14, 2001

(54) SYNCHRONOUS MULTIPLEXED NEAR ZERO OVERHEAD ARCHITECTURE FOR VACUUM PROCESSES

(75) Inventor: Gerald M. Cox, Lafayette, CA (US)

(73) Assignee: Matrix Intergrated Systems, Inc., Richmond, CA (US)

(*) Notice: Subject to any disclaimer, the term of this patent is extended or adjusted under 35 U.S.C. 154(b) by 0 days.

(21) Appl. No.: 09/314,193

(22) Filed: May 19, 1999

(51) Int. Cl.$^7$ .................................................. H01L 21/00
(52) U.S. Cl. ...................... 118/719; 156/345; 204/298.35
(58) Field of Search .............................. 118/719, 723 E, 118/723 R; 156/345; 204/298.35

(56) References Cited

U.S. PATENT DOCUMENTS

| | | |
|---|---|---|
| 5,138,973 | 8/1992 | Davis et al. . |
| 5,292,393 | 3/1994 | Maydan et al. . |
| 5,376,212 * | 12/1994 | Saiki .................... 156/345 |
| 5,515,986 | 5/1996 | Turlot et al. . |
| 5,567,268 | 10/1996 | Kadomura . |
| 5,647,945 * | 7/1997 | Matsuse et al. .............. 156/345 |
| 5,755,888 | 5/1998 | Torii et al. . |
| 5,855,681 | 1/1999 | Maydan et al. . |
| 5,900,105 | 5/1999 | Toshima . |
| 6,053,980 * | 4/2000 | Suda et al. .................. 118/719 |

* cited by examiner

Primary Examiner—Thi Dang
(74) Attorney, Agent, or Firm—Knobbe, Martens, Olson & Bear, LLP.

(57) ABSTRACT

Workpieces, such as, semiconductor wafers, are continuously manufactured by repetitively alternately switching a common radio frequency power source between a plurality of downstream or in-chamber processing reactors and actively processing one workpiece in a vacuum in an operating one of the processing chambers while simultaneously executing with a robot at atmospheric pressure the overhead tasks relative to next processing another workpiece in the other processing chamber. The active processing of the workpieces in alternate chambers does not overlap, and the robot starts and completes all of its preparatory tasks during the active processing step during the time when a chamber's door is closed thereby providing virtual zero overhead. System architecture allows eliminating all redundant components other than the dual chambers which operate in parallel. For a modest cost increase for the second chamber throughput is trebled and overall costs significantly reduced. Preferred modes include switching a common microwave power source between the pair of processing chambers, pumping down with a common vacuum pump, and stabilizing the chamber pressure with a common throttle valve.

28 Claims, 27 Drawing Sheets

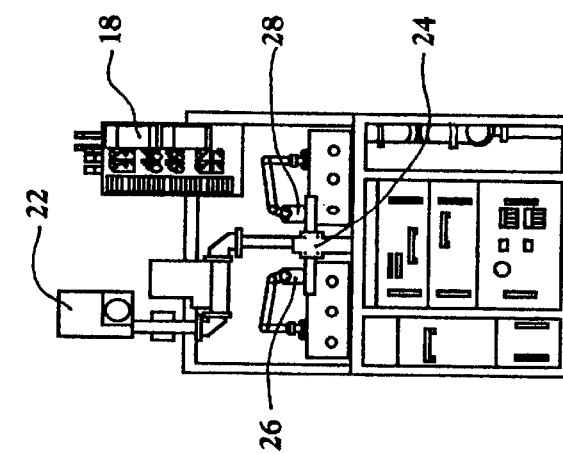
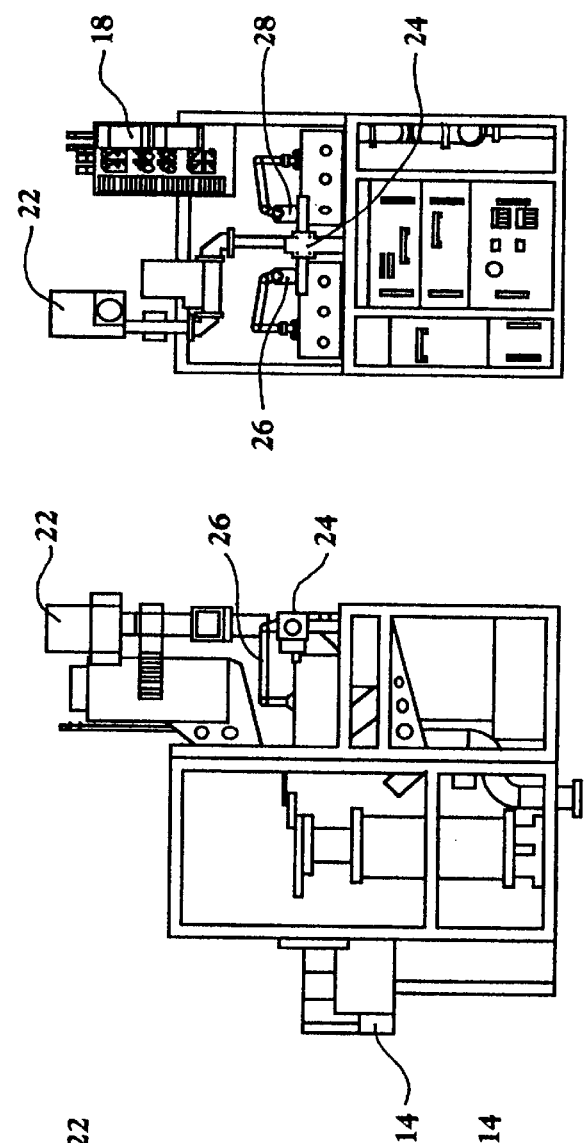
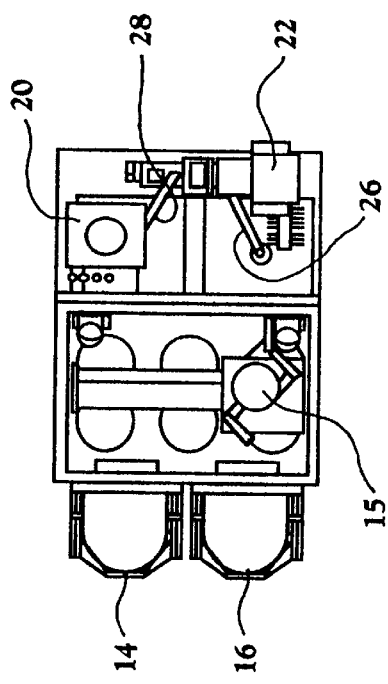
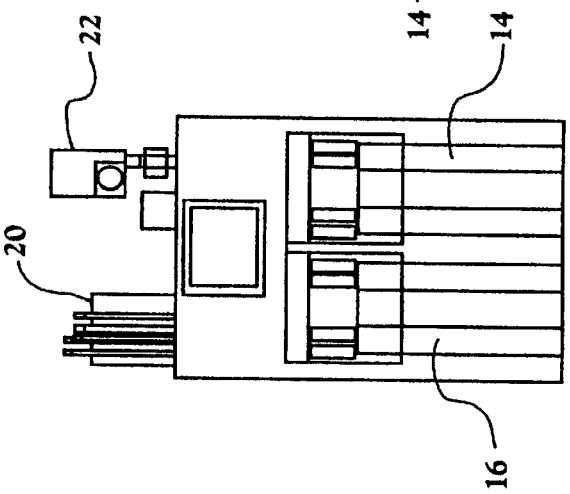

| | | |
|---|---|---|
| 1<br><br>FIG. 22 | 4<br><br>FIG. 25 | |
| 2<br><br>FIG. 23 | 5<br><br>FIG. 26 | 7<br><br>FIG. 28 |
| 3<br><br>FIG. 24 | 6<br><br>FIG. 27 | 8<br><br>FIG. 29 |

Fig. 21

| ID | Task Function | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 23 | Robot places wafer 3 in chamber 1 | | | | | | | | | | | | | | | | | | | | | | | |
| 24 | Robot rotates 180 degrees | | | | | | | | | | | | | | | | | | | | | | | |
| 25 | Robot stops to cool wafer | | | | | | | | | | | | | | | | | | | | | | | |
| 26 | Robot places processed wafer 1 in cassette | | | | | | | | | | | | | | | | | | | | | | | |
| 27 | Open chamber 2 door | | | | | | | | | | | | | █ | | | | | | | | | | |
| 28 | Close chamber 2 door | | | | | | | | | | | | | | | | █ | | | | | | | |
| 29 | Pins lower | | | | | | | | | | | | | | | | █ | | | | | | | |
| 30 | Chuck vacuum applies | | | | | | | | | | | | | | | | █ | █ | █ | █ | █ | █ | █ | |
| 31 | Pump down chamber 2 | | | | | | | | | | | | | | | | | | | | █ | █ | | |
| 32 | Wait for chamber 1 process | | | | | | | | | | | | | | | | | | | | | | | █ |
| 33 | Switch process gas on | | | | | | | | | | | | | | | | | | | | | | | |
| 34 | Process gas stabilization | | | | | | | | | | | | | | | | | | | | | | | |
| 35 | Uwave on | | | | | | | | | | | | | | | | | | | | | | | |
| 36 | Backfill chamber 2 | | | | | | | | | | | | | | | | | | | | | | | |
| 37 | Open chamber 2 door | | | | | | | | | | | | | | | | | | | | | | | |
| 38 | Robot gets wafer 4 from cassette | | | | | | | | | | | | | | | | | | | | | | | |
| 39 | Robot traverses to chamber 2 | | | | | | | | | | | | | | | | | | | | | | | |
| 40 | Robot retrieves wafer 2 from chamber 2 | | | | | | | | | | | | | | | | | | | | | | | |
| 41 | Robot places wafer 4 in chamber 2 | | | | | | | | | | | | | | | | | | | | | | | |
| 42 | Robot traverses to cassette 1 | | | | | | | | | | | | | | | | | | | | | | | |
| 43 | Robot stops to cool wafer | | | | | | | | | | | | | | | | | | | | | | | |
| 44 | Robot places processed wafer 2 in cassette | | | | | | | | | | | | | | | | | | | | | | | |

Fig. 23

| ID | Task Function | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 45 | Close chamber 1 door | | | | | | | | | | | | | | | | | | | | | | | |
| 46 | Pins lower | | | | | | | | | | | | | | | | | | | | | | | |
| 47 | Chuck vacuum applies | | | | | | | | | | | | | | | | | | | | | | | |
| 48 | Pump down chamber 1 | | | | | | | | | | | | | | | | | | | | | | | |
| 49 | Wait for chamber 2 | | | | | | | | | | | | | | | | | | | | | | | |
| 50 | Switch process gas on | | | | | | | | | | | | | | | | | | | | | | | |
| 51 | Process gas stabilization | | | | | | | | | | | | | | | | | | | | | | | |
| 52 | Uwave on | | | | | | | | | | | | | | | | | | | | | | | |
| 53 | Backfill chamber 1 | | | | | | | | | | | | | | | | | | | | | | | |
| 54 | Open chamber 1 door | | | | | | | | | | | | | | | | | | | | | | | |
| 55 | Robot gets wafer 5 from cassette | | | | | | | | | | | | | | | | | | | | | | | |
| 56 | Robot rotates 180 degrees | | | | | | | | | | | | | | | | | | | | | | | |
| 57 | Robot retrieves wafer 3 from chamber 1 | | | | | | | | | | | | | | | | | | | | | | | |
| 58 | Robot places wafer 5 in chamber 1 | | | | | | | | | | | | | | | | | | | | | | | |
| 59 | Robot rotates 180 degrees | | | | | | | | | | | | | | | | | | | | | | | |
| 60 | Robot stops to cool wafer | | | | | | | | | | | | | | | | | | | | | | | |
| 61 | Robot places wafer 3 in cassette | | | | | | | | | | | | | | | | | | | | | | | |
| 62 | Close chamber 2 door | | | | | | | | | | | | | | | | | | | | | | | |
| 63 | Pins lower | | | | | | | | | | | | | | | | | | | | | | | |
| 64 | Chuck vacuum applies | | | | | | | | | | | | | | | | | | | | | | | |
| 65 | Pump down chamber 2 | | | | | | | | | | | | | | | | | | | | | | | |
| 66 | Switch process gas on | | | | | | | | | | | | | | | | | | | | | | | |

SYNCHRONOUS MULTIPLEXED NEAR ZERO OVERHEAD ARCHITECTURE FOR VACUUM PROCESSES

BACKGROUND OF THE INVENTION

1. Fields of the Invention

The present invention relates generally to an apparatus and method for reducing workpiece handling overhead relative to active workpiece processing time in a manufacturing process, and, more particularly, to reducing the relative time spent pumping a vacuum in semiconductor wafer processing chambers, venting such chambers to atmosphere, and transferring wafers to and from such chambers while increasing the relative time spent actively processing the wafers in the chambers, such as, by actively etching, stripping, and depositing the semiconductive layers of the wafers, and, even more particularly, to the process of switching common RF or microwave power supply sources alternately between dual downstream or in-chamber plasma reactors and alternately actively processing in one reactor while performing the aforesaid overhead tasks on the other reactor thereby significantly increasing the throughput of the overall machine at overall reduction in equipment cost compared to conventional dual or multiple reactor systems.

2. Discussion of Background and Prior Art a. Generating a Plasma

The primary reason to generate a plasma is to generate an intense amount of heat in a localized area to excite atoms or molecules of gas to an elevated state. The energy can be so intense that some common compounds dissociate.

For example, $CF_4$, a stable compound gas, can have some of the fluorine atoms stripped off to form monatomic F which is extremely reactive. In the case of oxygen, it exists in nature as $O_2$ and not $O_1$. When oxygen is passed through an intense RF electric field, often produced by microwave radiation, a significant percentage actually separates into monatomic oxygen, $O_1$, and is far more reactive than $O_2$. The monatomic oxygen is also heated to temperatures as high or higher than 1000 degrees C. when in the plasma field. Photoresist is a carbon based or organic compound. When the wafer is heated to typically 220 to 270 degrees C. and subjected to the hot monatomic oxygen, the photoresist is combusted often within 10 to 15 seconds depending on thickness and other variables. The new compounds formed are generally $CO_2$, CO, and $H_2O$ which are gaseous at ambient conditions. The photoresist effluent is then pumped off in the gaseous state through a vacuum pump. In etch applications, different gas volatiles are formed.

Although plasmas can be created at atmospheric pressure, they are very difficult to ignite, difficult to control, consume enormous power, generate intense UV light, and are awkward to confine. Nearly all semiconductor process applications operate at greatly reduced pressures relative to atmospheric conditions. As a general class, plasma processing is typically conducted from a low range of 1 milli-Torr to a high range of roughly 10 Torr. For example, photoresist ashing or surface cleaning and preparation pressure ranges operate from about 0.1 Torr to 2 Torr.

Examples of methods to generate a plasma at rarified pressures are capacitively coupled electrodes, parallel plate reactive ion etchers (RIE), inductively coupled plasma (ICP) methods involving a resonant RF coil, microwave cavities, and electron cyclotron resonance (ECR). Some embodiments also include magnetic fields for shaping the plasma.

b. Vacuum Processing

Semiconductor silicon wafer processes, such as, actively etching, stripping, and depositing the semiconductor layers of the wafers, are generally performed under greatly reduced atmospheric pressure conditions ranging generally from well under the $10^{-3}$ Torr regime to a few Torr in order to readily establish plasma conditions exciting the process gas with RF or microwave energy. Plasma excited process gas species have greatly elevated reaction levels to speed combination with the intended semiconductor layer to be processed. This vacuum processing contributes substantially to the high cost of semiconductor processing equipment itself (vacuum pumps alone cost about $40,000.00) and the relatively excessive amount of time (typically 65–80% of a complete cycle) spent in the overhead tasks of pumping a vacuum, venting to atmosphere, transferring wafers to and from, opening and closing doors, metering gases in and out, and the like. Moreover, each of these subsystems is typically contained in a multi-chamber machine, providing 100% redundancy at great expense in terms of equipment cost and space. Nakane U.S. Pat. No. 4,483,651 (2:10–13).

c. Cost of Semiconductor Equipment

On one hand, when examining the cost of semiconductor wafer processing equipment, one quickly realizes that relatively few system components comprise the vast majority of the total equipment costs. The process gas mass flow controllers, the RF power sources, such as, microwave and lower frequency RF power supplies, and the vacuum pumps are among the largest high cost items followed by the actual process reactor. Significant savings can be immediately achieved simply by developing a process which increases throughput by using dual, side-by-side replicas of selected critical costly items, but one of everything else.

Accordingly, it is an object of the present invention to significantly reduce the overall costs of semiconductor processing equipment, and especially atmosphere to vacuum equipment, by eliminating all redundant components of a plural setup other than the dual, side-by-side, wafer processing chambers.

d. Overhead Time

On the other hand, when examining the typical overhead tasks performed by the semiconductor wafer processing equipment, including (1) wafer transfer from the cassette to the chamber entrance and later back to the cassette; (2) chamber door opening and closing; (3) wafer exchange to and from the process chamber; (4) wafer heating or cooling preparation; and (5) pumping or venting the process reactor chamber to the desired vacuum level, or conversely, to an elevated pressure, one quickly recognizes that a significant savings can be immediately achieved by coordinating and sharing, that is, synchronously multiplexing, common material support sub-assemblies which perform overhead tasks.

As one example of the relative speed of one type of semiconductor processing machine, such as a photoresist ashing machine, the fastest photoresist, strip, dual process chamber module unit in the marketplace today runs at typically 110–130 wafers per hour.

Accordingly, it is an object of the present invention, by adding redundancy of one critical stage of a single process machine at only a modest cost increase while synchronously multiplexing the remaining components of the processing system, virtually 100% of the wafer exchange overhead, the pump/vent overhead, and the wafer temperature conditioning overhead commonly associated with preparing an environment for wafer chemical processing to commence is eliminated or masked.

e. Current Semiconductor Atmosphere to Vacuum Continuous, Synchronously Multiplexed, Wafer Transfer Systems (1). Solo Wafers, Early Attempts.

Early attempts to solve the problem of high expense, high overhead wafer processing are seen in Uehara U.S. Pat. No. 4,149,923 in which single wafer, single processing chambers, each separately pumped, were replaced by multi-chamber, sequential processing of single wafers all in one common vacuum, and in the system by Nakane '651 referenced above in which a computer controlled a common main wafer transfer mechanism operating in parallel with plural plasma reactors each fed by its own branch shuttle wafer transfer mechanism and each having its own vacuum pump. While achieving some economies through a common vacuum and by an automatic parallel scheme, Uehara and Nakane left too much redundancy in their entire systems.

(2). Group Batch Process

Another method commonly in use reduces the pump and vent overhead time by pumping and venting an entire group of wafers in a load lock all at one time, typically a cassette of 25 or more wafers. In an early system by Blake in U.S. Pat. No. 5,019,233 plural, separately pumped, single process, chambers are serviced by a central interior substrate handling robot which services dual load lock chambers alternately loaded with 25-piece substrate batches. While one batch is being subjected to load lock evacuation providing thermal desorption, the other batch, having been previously evacuated is transferred one at a time to selected process chambers by the central interior robot. Therefore, load lock dwell times are ordered parallel to the active (coating) process, and extended load lock dwell times do not impair apparatus productivity until the batch lock dwell time exceeds the time needed for the serial processing of a full batch of individual cassettes.

There are good reasons for transferring wafers within a vacuum environment including toxic gas control, sequential processes where exposure to air affects the process, and moisture control for cold process where moisture can freeze to surfaces. Moreover, while wafer transfer time within a vacuum equalized environment is faster, nonetheless, it continues to be an appreciable percentage of the total productive wafer process time.

Thus, while Blake's system improves overall system throughput, it is far from optimal because the cost of a cassette vacuum load lock is quite expensive especially when coupled with an expensive vacuum wafer transfer robot, and it can never provide true zero overhead because of the overhead inherently required in sequential processing of the substrate stack through plural process chambers.

In a more recent attempt by Begin in U.S. Pat. No. 5,310,410, plural, individually pumped, processing chambers each for a different function serviced by an interior central robot in a sequential processing process were provided with atmospheric level processing chambers interspersed therebetween. While this system no doubt provided the claimed increase in flexibility, it did so at a great increase in equipment cost and overhead.

Finally, in an even more recent example, by Higashi in U.S. Pat. No. 5,611,861, after describing the failure of early solo wafer processing systems to achieve sufficient throughput, after describing the failure of early batch wafer processing systems to achieve sufficient uniformity and throughput, after describing the failure of early multi-chamber wafer processing systems to achieve sufficient increase in throughput because the transfer overhead time exceeded the processing time of the processing chambers and finished wafers had to wait for transfer, and, therefore, in a further effort to increase throughput in even multi-chamber processing systems, Higashi proposed putting the plural processing chambers on a carousel supported by two fixed, spaced apart, transfer stations adjacent the carousel, one for transferring unprocessed wafers into a processing chamber in hermetically sealed fashion and the other for transferring processed wafers to the outside as the carousel rotates the processing chambers sequentially into alignment with one or the other transfer station while wafer processing is taking place therebetween. Each of Higashi's processing chambers has its own high frequency power supply for its plasma reactors. Again, we see the prior art achieve increased throughput at the expense of significantly increased equipment cost with complete 100% redundancy of critical costly items in each processing chamber without significantly improving machine component efficiency or utilization.

f. Current Semiconductor Dual Chamber Alternating Power Supply System

In a semiconductor alternating dual processing chamber system by Oramir located in Israel, it is known to alternate the power source between the dual chambers in an application which uses a raster scan laser to ablate photoresist on a semiconductor wafer in an ozone ambient at atmospheric pressure. However, this feat is accomplished by merely deflecting the laser beam with a mirror alternately from one process chamber to the other. Obviously, Oramir's system is extremely expensive and slow and is not price or throughput competitive even with conventional machines on the market. Moreover, the entire process is performed at atmospheric or near atmospheric conditions, not at typical low pressure vacuum levels. Furthermore, due to the special complexities associated with deep vacuum processing and RF power switching, there is no suggestion by Oramir to provide, and, accordingly, it is an object of the present invention to provide, a switchable radio frequency power supply alternately, synchronously multiplexed with atmosphere to vacuum dual processing chambers.

It has been amply demonstrated above that there is still a long felt need for, and it is an object of the present invention to provide, a process of providing radio frequency power alternately between dual, adjacent, downstream or in-chamber plasma reactors and actively processing in one without overlapping the processing in the other while performing the aforesaid overhead tasks in the other thereby significantly increasing the throughput of the overall machine at a substantial overall reduction in equipment cost.

SUMMARY OF THE INVENTION

Set forth below is a brief summary of the invention which achieves the foregoing and other objects and provides the foregoing and hereafter stated benefits and advantages in accordance with the structure, function and results of the present invention as embodied and broadly described herein. Applicant's invention includes independently both the apparatus and the methods described herein which achieve the objects and benefits of the present invention. Both formats of the invention are described below, and it is applicant's intention to claim both formats even though from time to time below for purposes of clarity and brevity applicant will use either one or the other format to describe various aspects and features of the invention.

A first aspect of the invention is method of continuously processing a plurality of workpieces which includes the steps of supplying radio frequency power to one of a pair of processing chambers, actively processing a workpiece in a deep vacuum solely in the one processing chamber while simultaneously executing at substantially atmospheric pressure substantially all post-processing and pre-processing overhead tasks relative to processing another workpiece in the other processing chamber, and then reversing the aforesaid steps by power supplying the other processing chamber and actively processing the other workpiece in a deep vacuum solely therein while simultaneously executing at substantially atmospheric pressure substantially all overhead tasks relative to processing a third workpiece in the one processing chamber, and continuously repeating all of the aforesaid steps in sequence.

Further features of this aspect of the invention include placing the chambers adjacent, supplying microwave power, synchronously multiplexing a common radio frequency power source between the pair of processing chambers, actively processing the workpieces in a downstream or in-chamber plasma reactor, actively processing one workpiece in one processing chamber without overlapping the processing of another workpiece in the other chamber, beginning the actively processing step with closing the door of the chamber with the workpiece to be processed next inside and ending that step with the opening of the door of that chamber at the completion of the processing of that workpiece, and robot starting and completing all of the overhead tasks between the beginning and ending of the actively processing step.

A second aspect of the invention is a method of continuously manufacturing a plurality of workpieces which includes the steps of alternately switching a common radio frequency power source between plural processing chambers, and actively processing a workpiece in a deep vacuum processing chamber while simultaneously executing at substantially atmospheric pressure the post-processing and pre-processing overhead tasks relative to next processing another workpiece in a non-operating other one of the processing chambers, and continuously repeating all of the aforesaid steps in sequence.

Further features of this aspect of the invention include the steps of processing in dual chambers, placing the processing chambers adjacent, synchronously multiplexing a microwave power source between the pair of processing chambers, actively processing the workpieces in a downstream or in-chamber plasma reactor, actively processing one workpiece in one processing chamber without overlapping the processing of another workpiece in the other processing chamber, beginning the actively processing step with closing the door of the chamber with the workpiece to be processed next inside and ending that step with the opening of the door of that chamber at the completion of the processing of that workpiece, and a robot starting and completing all of said tasks between the beginning and ending of the actively processing step.

A third aspect of the invention is a continuous method of processing workpieces through dual processing chambers which includes the steps of (a) switching a common power source to the first chamber ON and to the second chamber OFF, (b) processing the workpiece in the first chamber to completion while simultaneously removing the processed workpiece from the second chamber and reloading the second chamber with another workpiece to be processed, (c) switching the common power source to the first chamber OFF and to the second chamber ON, (d) processing the workpiece in the second chamber to completion while simultaneously removing the processed workpiece from the first chamber and reloading the first chamber with yet another workpiece to be processed, and (e) continuously repeating steps (a)–(d).

A fourth aspect of the invention is a continuous method of processing workpieces through a single first stage processor and dual chambers of a second stage processor comprising the steps of (a) switching the output of a first stage processor to a first path while blocking the output of the first stage processor to a second path and closing the second path, (b) processing the workpiece in a first chamber of a second stage to completion while simultaneously removing a processed workpiece from a second chamber of the second stage and reloading the second chamber of the second stage with another workpiece to be processed, (c). switching the output of the first stage processor to the second path, while blocking the output of the first stage processor to the first path and closing the second path, (d) processing the workpiece in the second chamber of the second stage o completion using the output of the first stage while simultaneously removing the processed workpiece from the first chamber of the second stage and reloading the first chamber of the second stage with another workpiece to be processed, and (e) continuously repeating steps (a)–(d).

Some of the many advantages of the present invention are:

1. The overall system architecture eliminates redundant parts and, through sharing of components allows, the overwhelming majority of high cost subsystems to be amortized between the two process chambers, including, for example, the common switchable RF power supply, throttle valve, gas box, pressure transducers, and vacuum pumps.

2. This invention is applicable to both deposition and etch semiconductor processes and their variations, including, for example, photoresist removal, wafer cleaning, and the like.

3. The system architecture utilizing two process chamber reactors with power supply switching and alternate synchronous multiplexed processing is novel.

4. At least for those wafer processes that do not require sequential wafer transfer within a vacuum, the system achieves results which exceed those of a vacuum load-locked system without the added cost of the load-locks and vacuum wafer transfer robot.

5. The system achieves virtual continuous non-stop wafer processing essentially negating all of the normal overhead associated with wafer transfer between atmospheric and vacuum conditions.

6. The system greatly improves overall machine throughput and utilization without materially increasing system cost for atmosphere to vacuum processes.

7. Recognizing that the alternate use of two process reactors is in actual practice a single process module, the projected system throughput can more than double to beyond 200 wafers per hour with generally only a 10 to 20% increase in system cost.

BRIEF DESCRIPTION OF THE DRAWINGS

FIG. 3 is a front elevation view of FIG. 1.

FIG. 4 is a right side elevation view of FIG. 1.

FIG. 5 is a rear elevation view of FIG. 1.

FIG. 6 is a top plan view of FIG. 1.

FIG. 21 is a schematic representation of how the individual enlarged line graphs of FIGS. 22–29, each of which shows a portion of a third working example of the present invention which is shown completely in FIG. 30, fit together to produce the single large line graph which is shown greatly reduced in FIG. 30.

FIG. 23 is a line graph of a detailed task function timing diagram of a second portion of the working example of FIG. 30.

FIG. 24 is a line graph of a detailed task function timing diagram of a third portion of the working example of FIG. 30.

Figure 28:
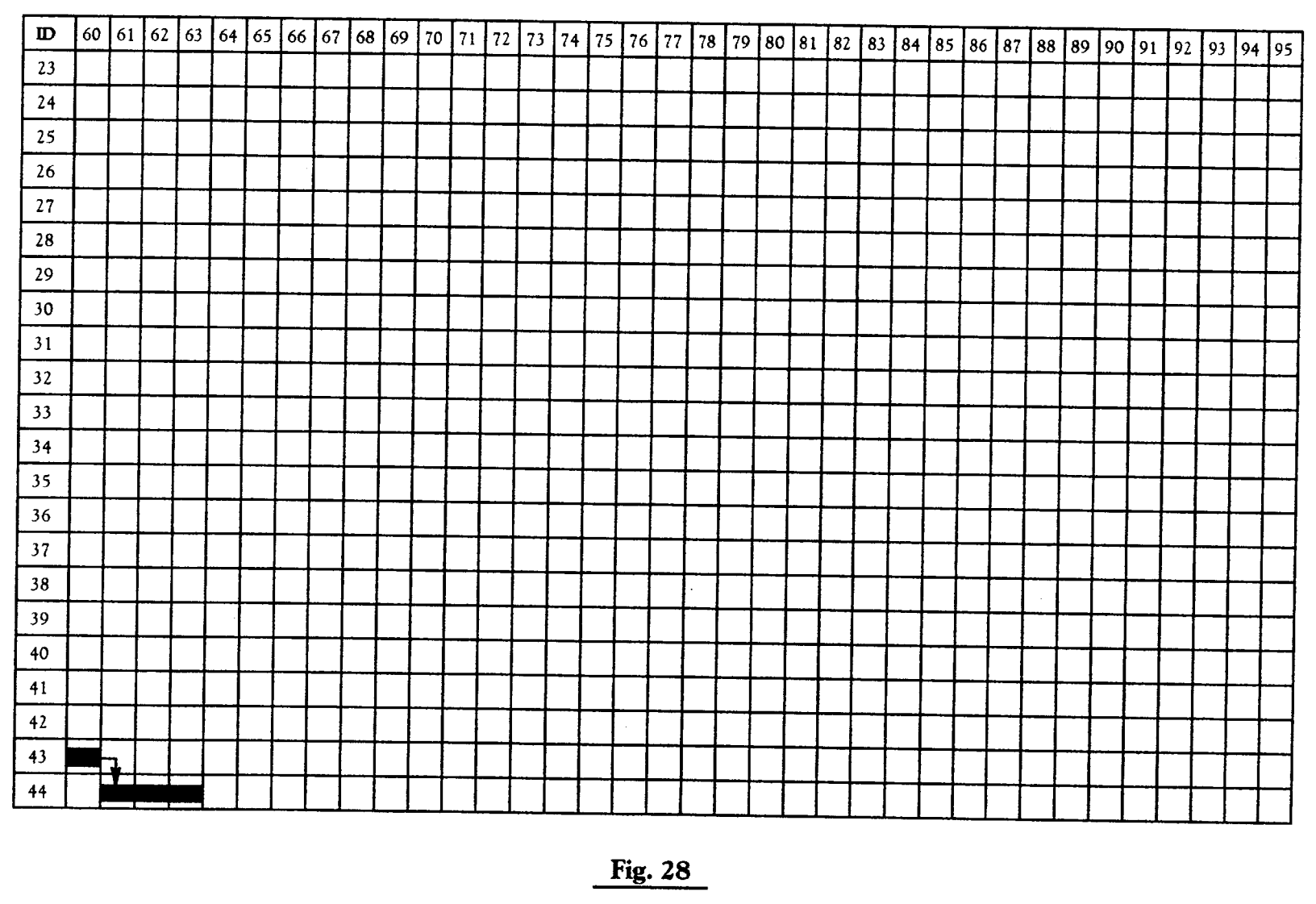

FIG. 28 is a line graph of a detailed task function timing diagram of a seventh portion of the working example of FIG. 30.

DETAILED DESCRIPTION OF THE PREFERRED EMBODIMENT

1. Overview

Figure 15:
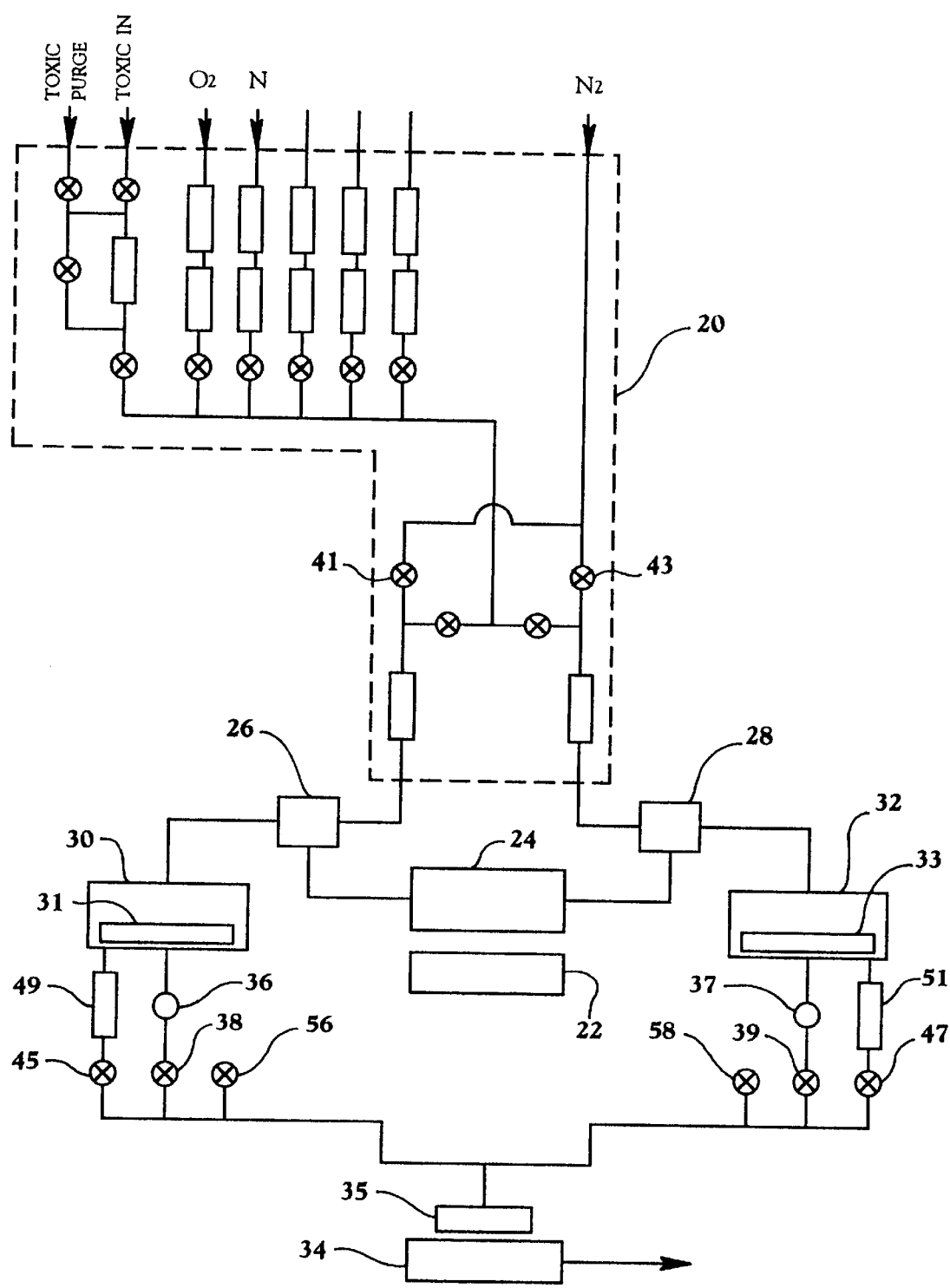
FIG. 15 is a more detailed schematic flow diagram of a dual downstream reactor version of the present invention using a single vacuum pump and dual throttle valves.
Figure 17:
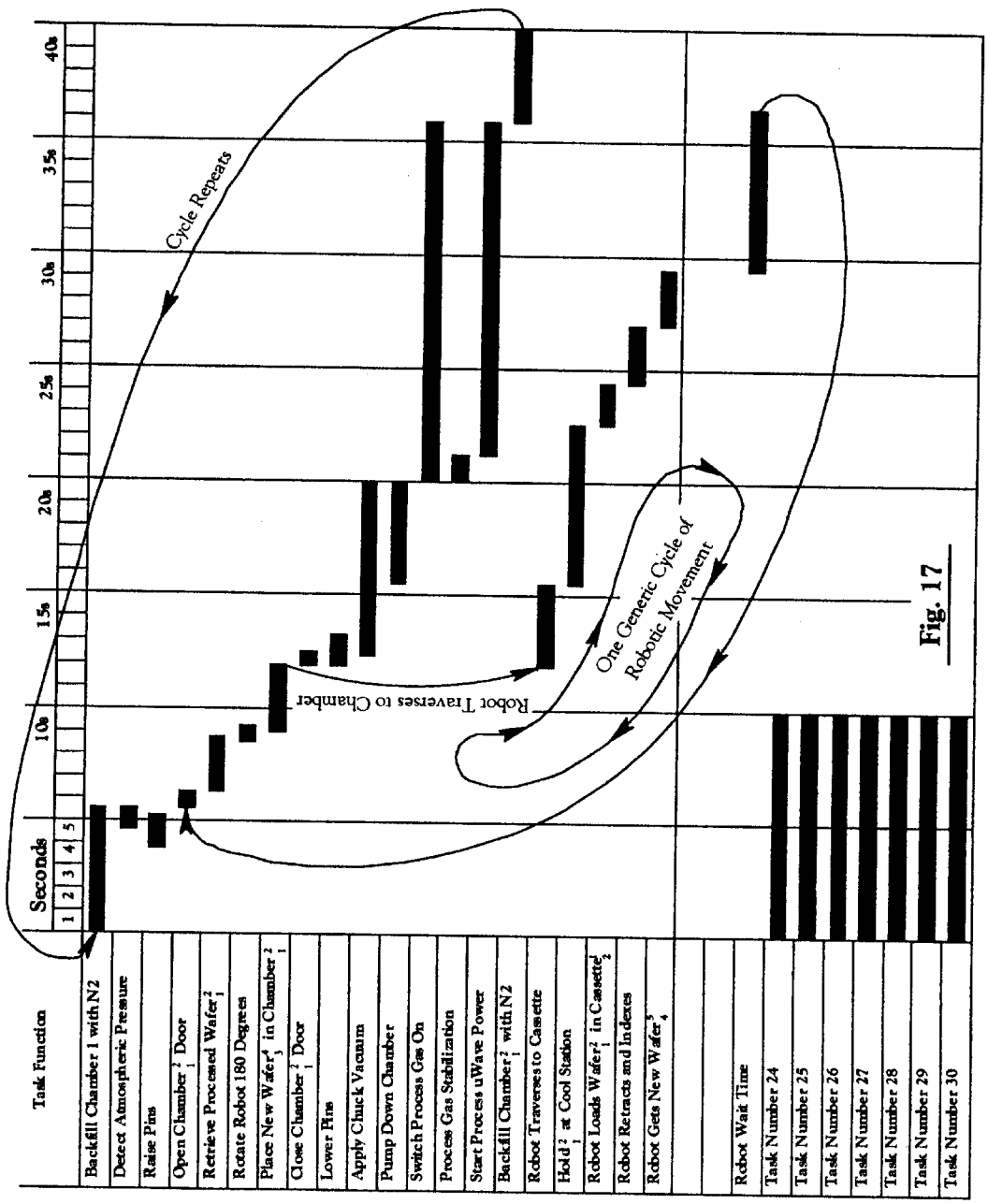
FIG. 17 is a line graph of a detailed task function timing diagram of a first working example of a dual, same single process, downstream reactors version of the present invention using two exterior (relative to the vacuum) 25-wafer cassettes and a single exterior robot with one front arm and one rear arm. The same sequence would be followed using a single 25-wafer cassette.
Figure 18:
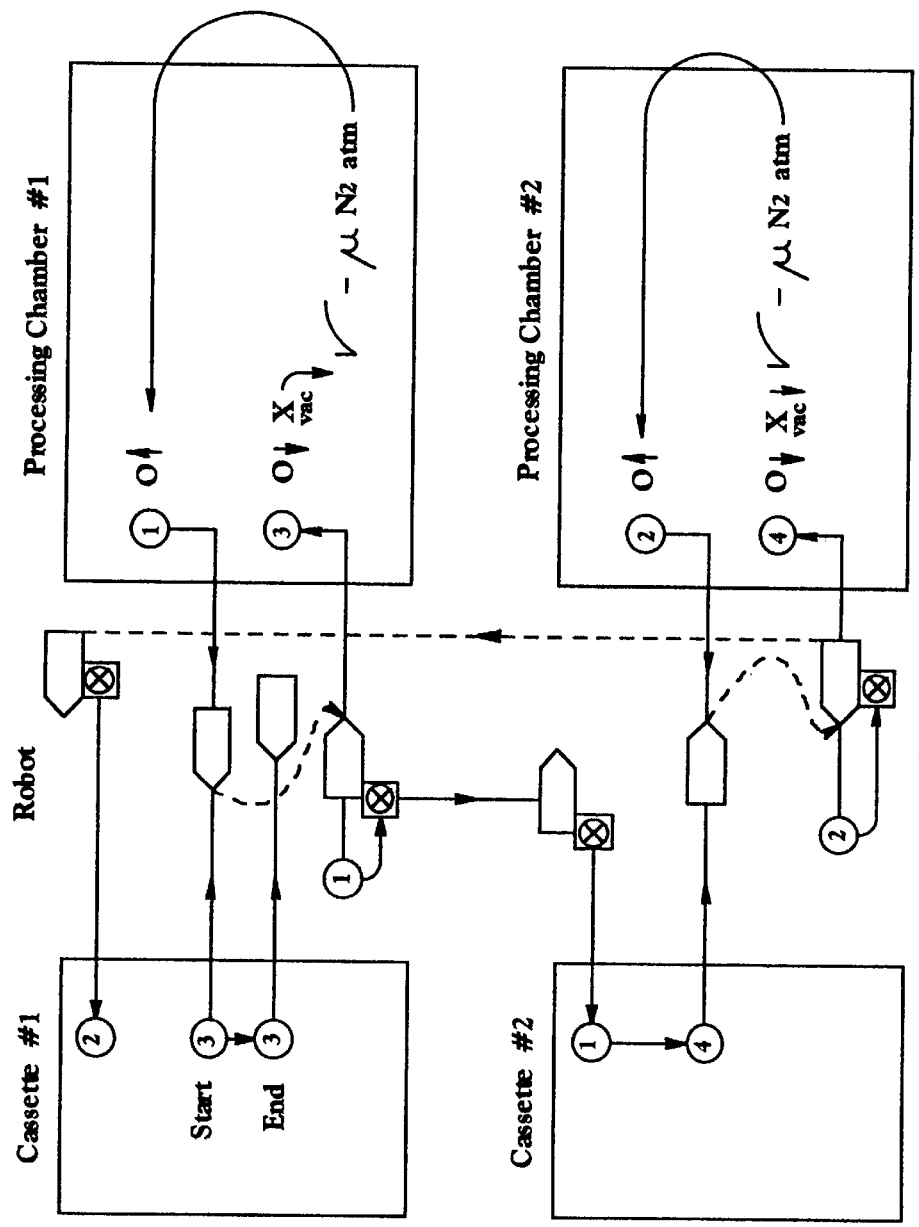
FIG. 18 is a schematic representation tracing the robot movements and processing of the working example of FIG. 17 using two cassettes.

As best seen in FIGS. 15,17,18 the synchronous multiplexed near zero overhead system architecture 10 of the present invention has the typical set of one group of mass flow controllers controlling process gases 20, microwave and RF power sources 22, and optionally a single source of vacuum 34. The key difference is the addition of the second of two process reactor chamber 30,32. Wafer processing alternates between the two process chambers 30,32. While one reactor chamber 30 is processing a wafer, the other chamber 32 is being vented 43 (FIG. 15) back to atmosphere, the completed wafer is exchanged with a new unprocessed wafer, and the other chamber 32 is pumped back to the desired vacuum level. Optional wafer temperature conditioning 31,33 is performed just prior to pump down or during vacuum pump down. Process gases and vacuum sources are alternated 20 to the appropriate process chamber 30,32 along with the associated microwave or RF power sources 22 via a relay and/or microwave switch 24.

To reach peak optimization, the robotic transfer overhead plus pump and vent overhead time should be less than the total active wafer processing time. (FIG. 17) In this mode, a near 100% equipment utilization condition for active process is achieved versus the typical situation of 30% utilization, or even less for short process times. While the additional process chamber 30,32 adds to system cost, even so, the added amount represents only 10 to 20% of the total system cost. For advanced systems in the marketplace today, the present invention increases overall throughput substantially by roughly double the normal throughput of the prior art.

Figure 2:
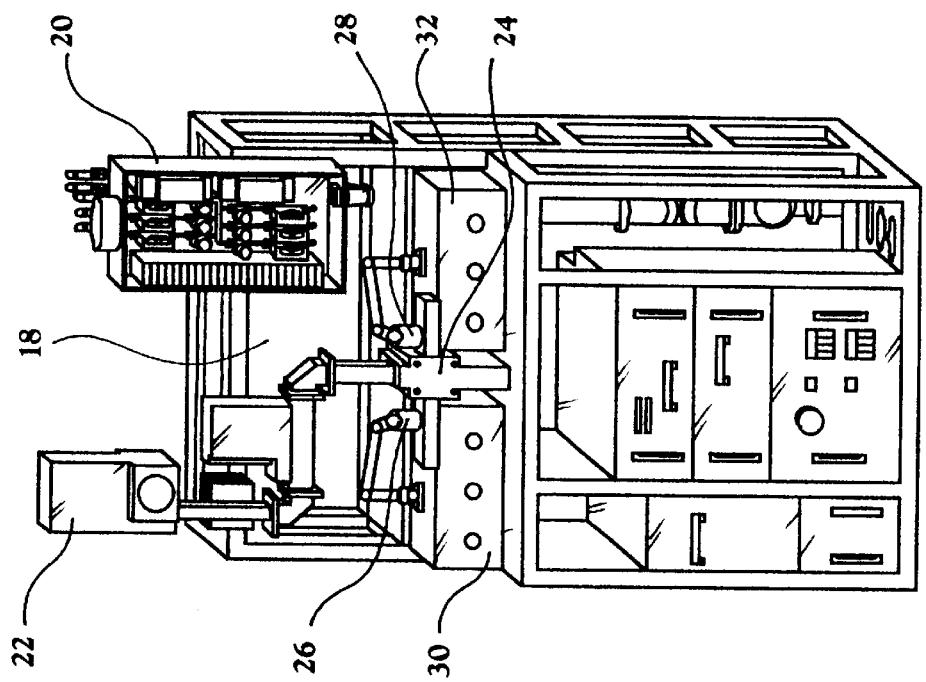
FIG. 2 is a rear perspective view of FIG. 1.
Figure 1:
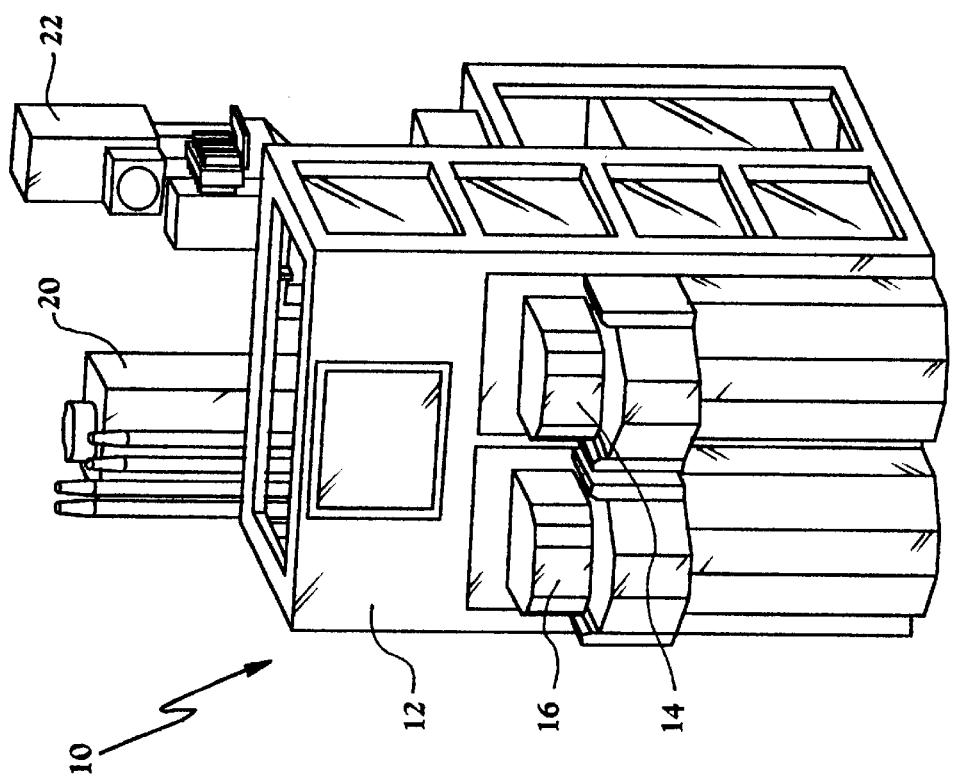
FIG. 1 is a left front perspective view of a complete assembly of a dual chamber version of the preferred embodiment of the present invention.
Figure 7:
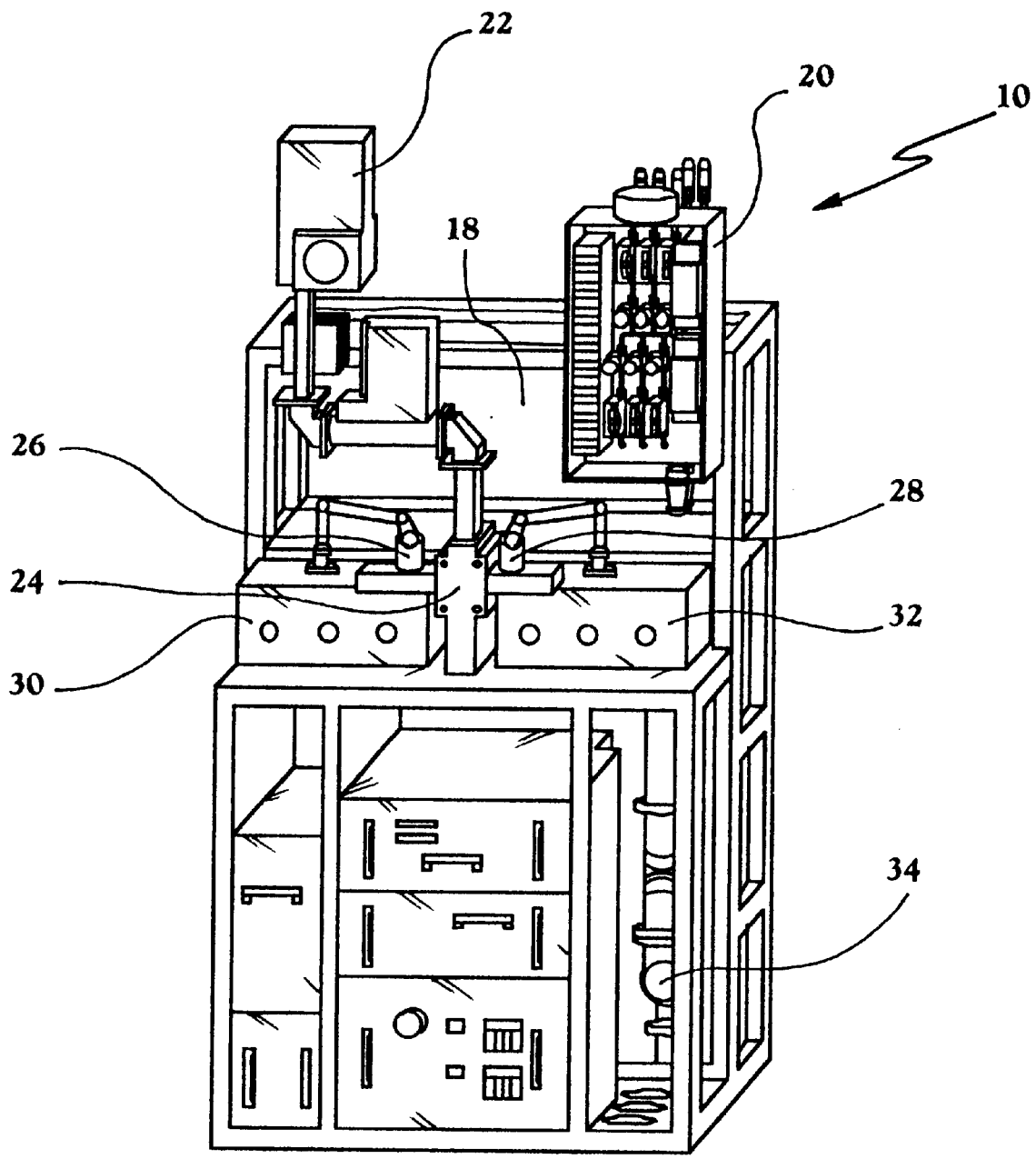
FIG. 7 is an enlarged view of FIG. 2.
Figure 8:
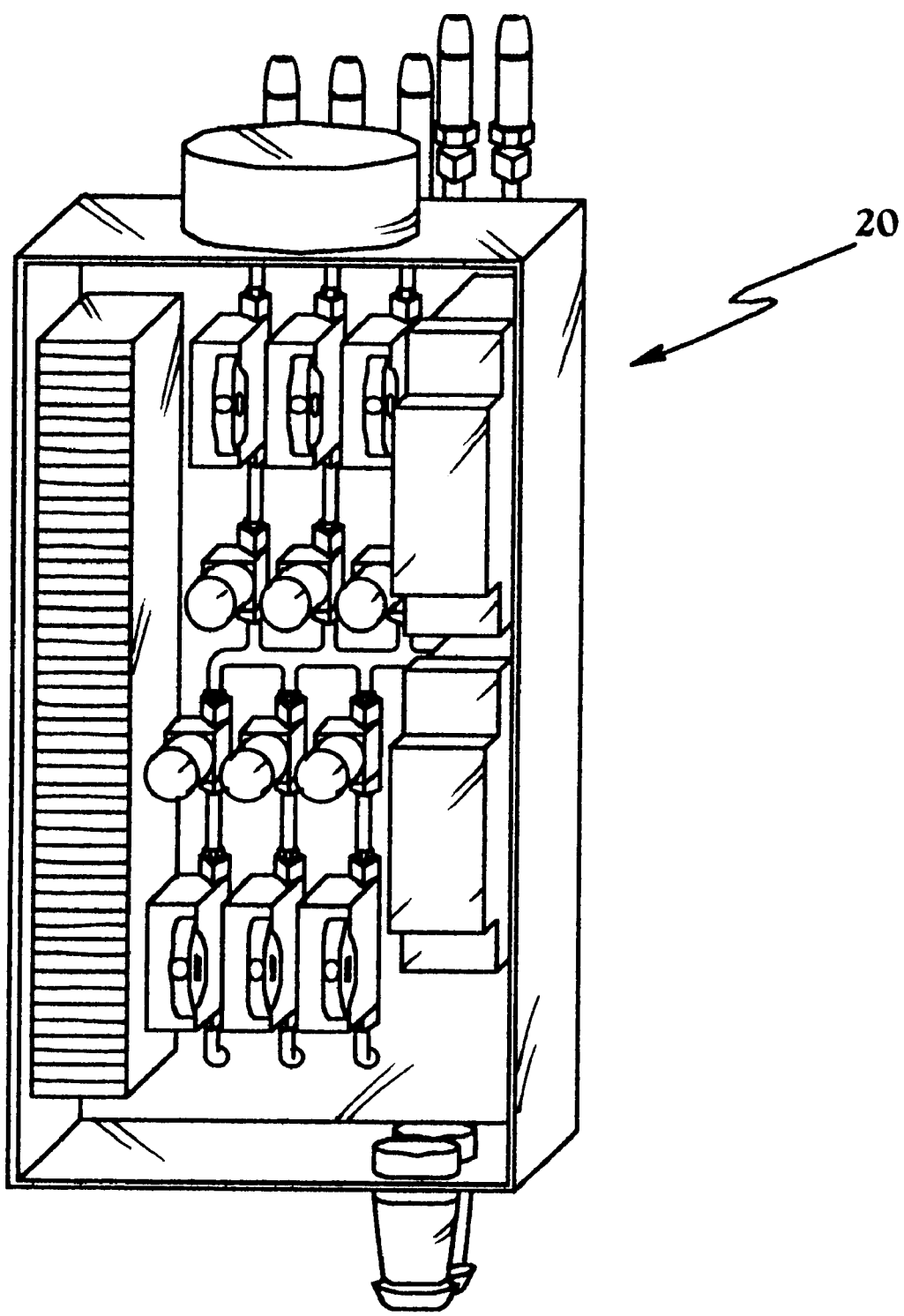
FIG. 8 is an enlarged view of the process gas distribution box of the present invention.
Figure 9:
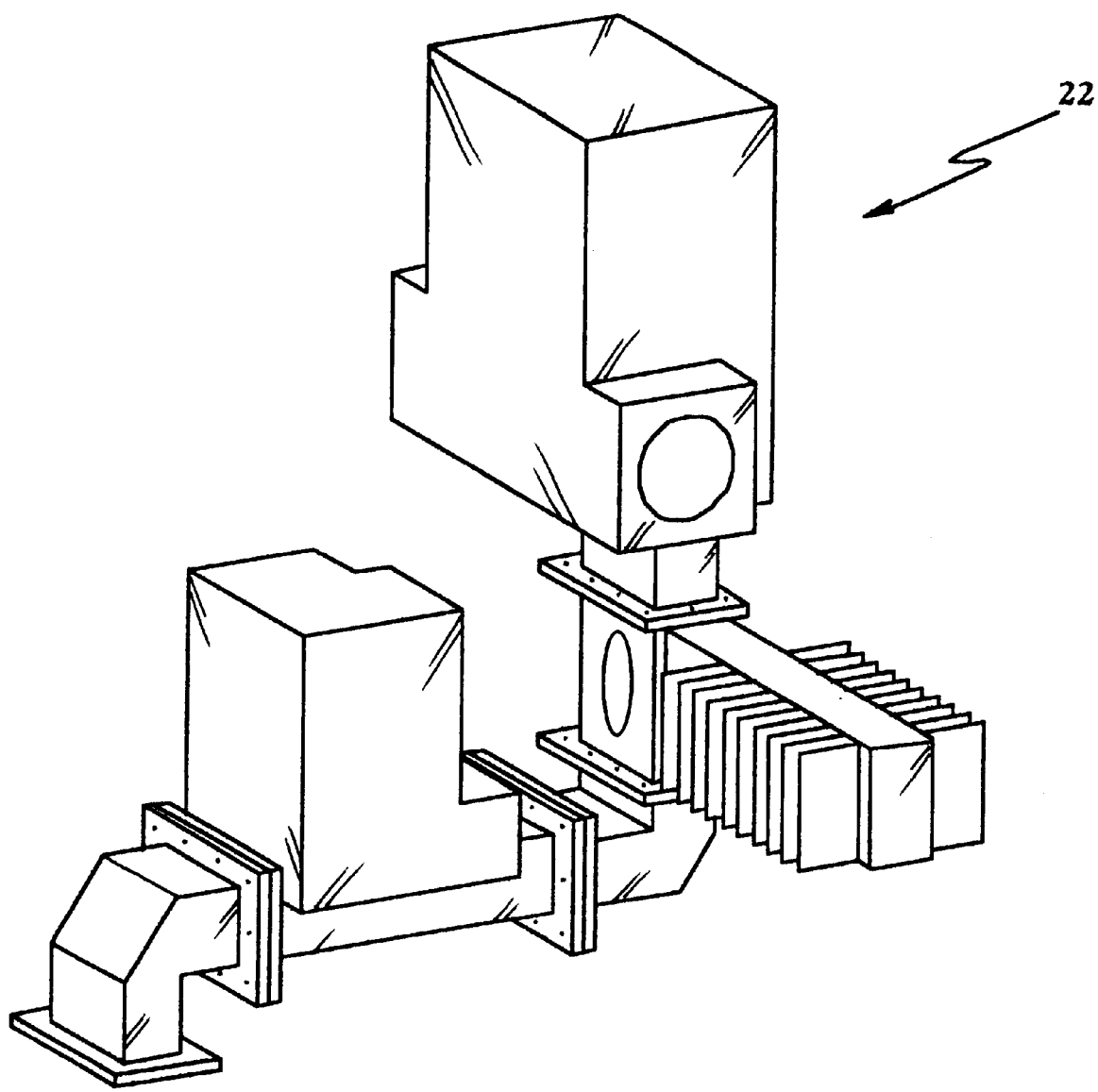
FIG. 9 is an enlarged view of the microwave generator of the present invention.
Figure 10:
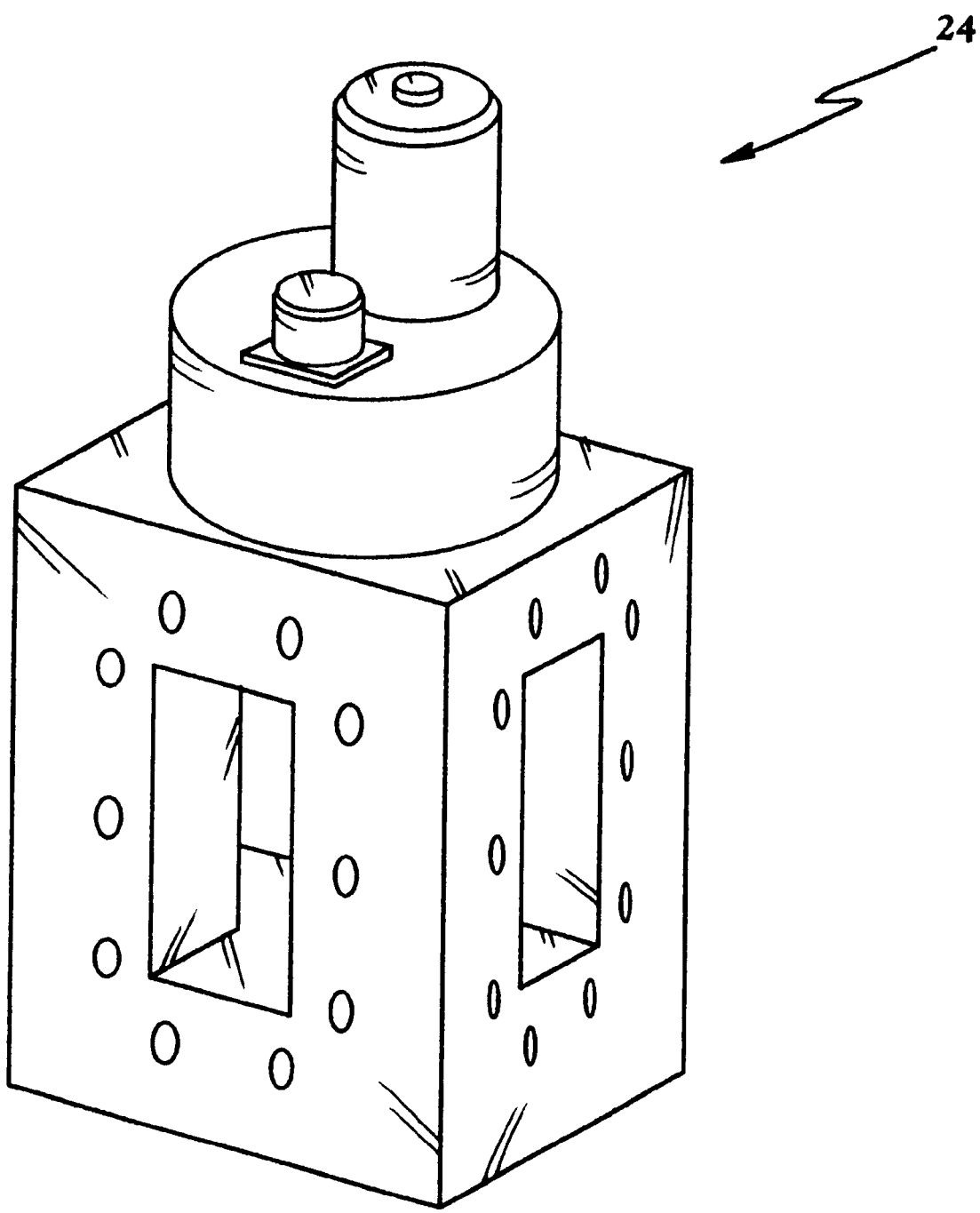
FIG. 10 is an enlarged view of the microwave switch of the present invention.
Figure 11:
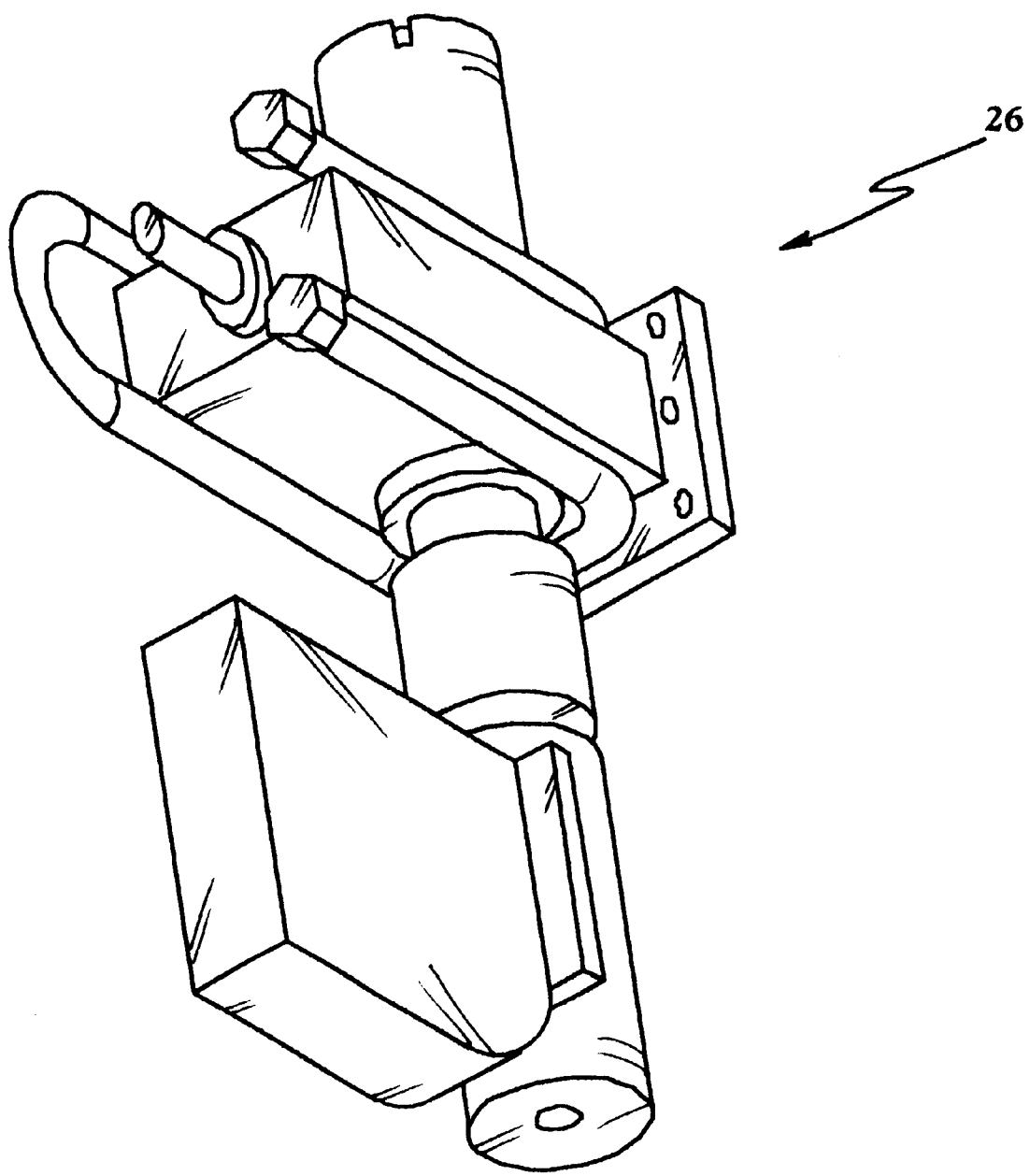
FIG. 11 is an enlarged view of one of the plasma sources of the present invention.
Figure 12:
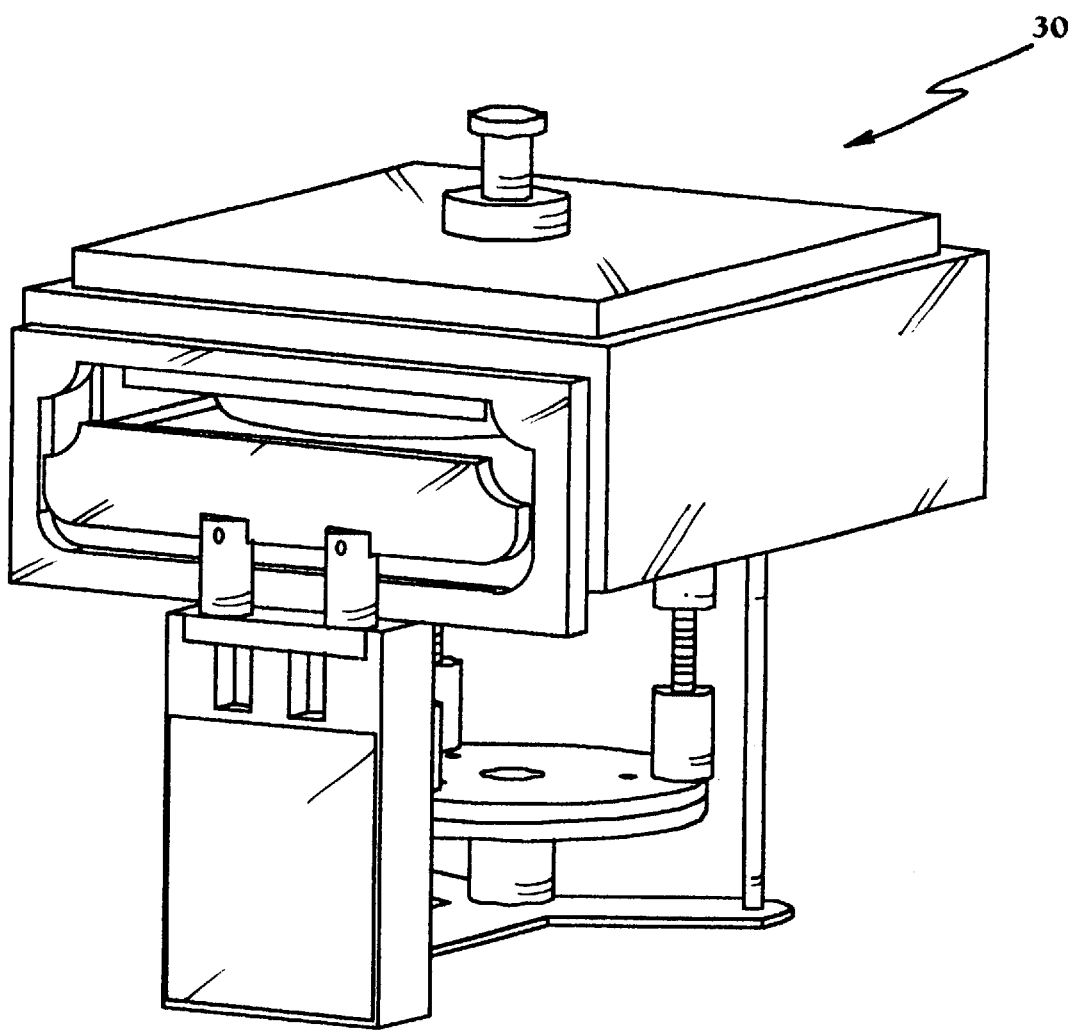
FIG. 12 is an enlarged view of one of the wafer process chambers of the present invention.
Figure 13A:
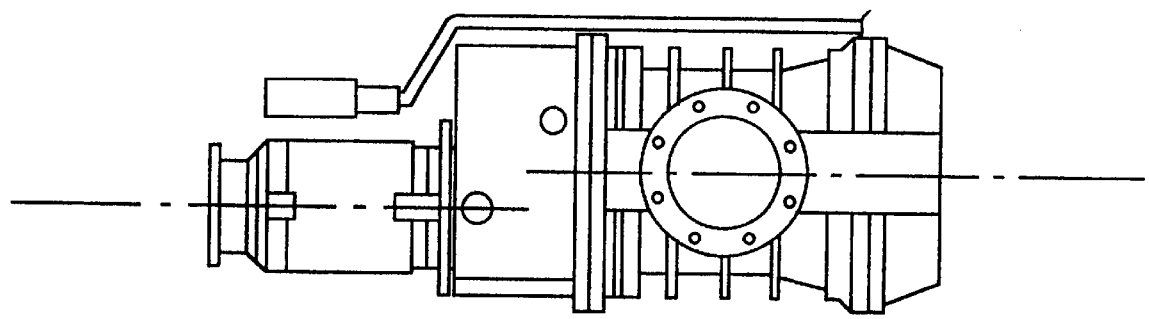
FIGS. 13A–13E are, respectively top plan, bottom plan, rear elevation, right side elevation and left side elevation views of one of the vacuum pumps of the present invention.
Figure 13B:
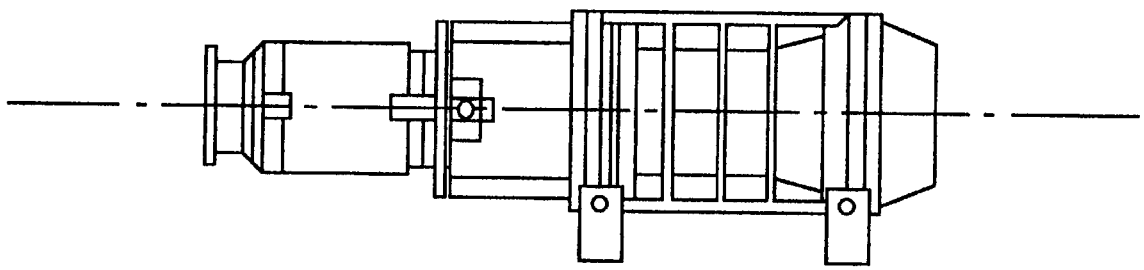
Figure 13C:
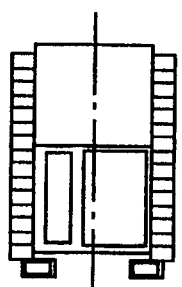
Figure 13D:
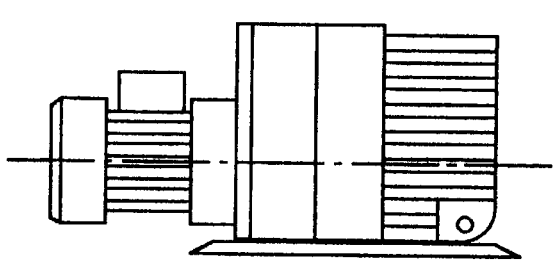
Figure 13E:
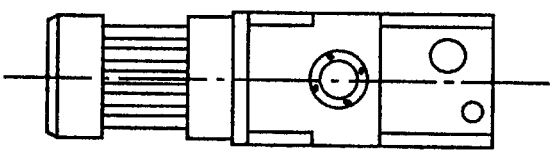

More particularly, as best seen in FIGS. 1–13, the overall assembly 10 of the computer controlled, synchronous, multiplexed, near zero overhead, architecture for vacuum processes of the present invention is shown in a preferred embodiment that includes in its most general form a computer shown in FIG. 7, a front panel 12 (FIGS. 1,3), at least one cassette 14,16 (FIGS. 1,3,6), a robot 15 (FIGS. 4,6), a back panel 18 (FIGS. 2,7), a process gas distribution box 20 (FIGS. 2,7,8), a microwave generator 22 (FIGS. 1,2,7,9), a microwave switch 24 ((FIGS. 2,5,7,10), at least one plasma source 26, 28 (FIGS. 2,5,7,11) and at least two processing chambers 30,32 (FIGS. 1,7,12), and at least one vacuum pump 34 (FIGS. 7,13).

Figure 14:
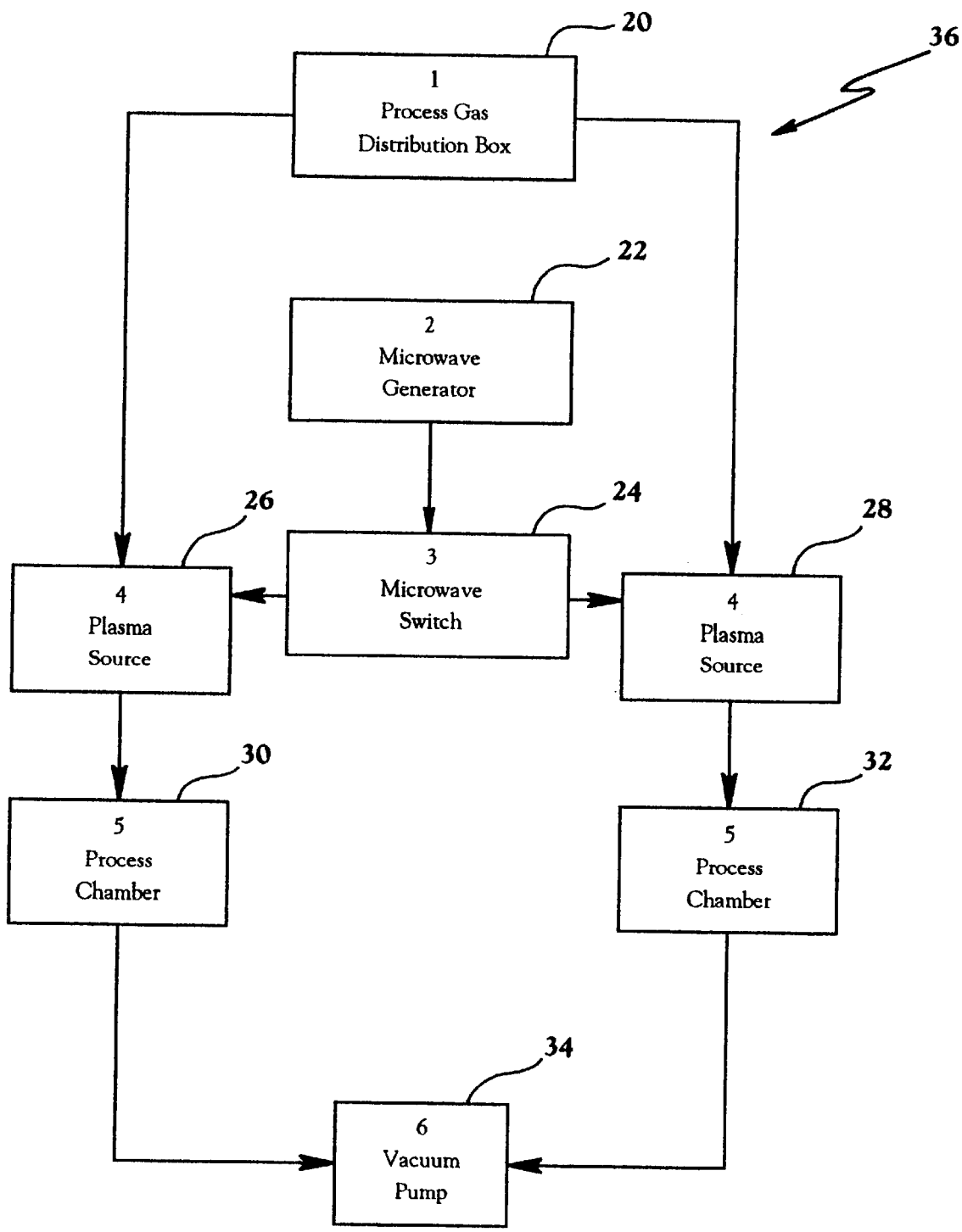
FIG. 14 is a general schematic flow diagram of a dual downstream reactor version of the present invention using a single vacuum pump.

In a typical general process of the present invention as seen in schematic form in FIGS. 14,17,18 the process chambers 30,32 are identical single process chambers set up to run the same or similar process in a vacuum. The process cycle can be best explained by examining the movements of the robot 15. We can start by looking at the robot 15 in mid-cycle removing a previously processed wafer from one previously vented 20 chamber 30 with one gripper and replacing it with an unprocessed wafer previously removed from a cassette 14,16 (one or more cassettes may be used) with its other gripper. A vacuum 34 is drawn in that chamber 30 and the active wafer processing begins there by igniting the plasma 26 for that chamber by switching 24 on the common microwave energy generator source 22 to it. While the first wafer is being processed in the one chamber 30, the robot 15 moves to the cassette 14,16 while the still hot processed wafer (in the case of photoresist ashing) it is carrying is cooled and loads that wafer into the cassette 14,16 while removing a second unprocessed wafer and turns to the now vented 20 other chamber 32 which has just finished processing a wafer also previously deposited in it. The robot 15 removes the processed wafer from the other chamber 32 replacing it with the second unprocessed wafer in its other gripper. While the second wafer is being processed in the other chamber 32, the robot again moves to the cassette 14,16 while the still hot processed wafer it is carrying is cooled and loads that wafer into the cassette 14,16 while removing a third unprocessed wafer and again turns back to the now vented 20 one chamber 30 which has just finished processing the first wafer, and the cycle repeats.

The overhead is near zero if all chamber 30,32 overhead processes and robot 15 overhead processes (that is, all pre- and post-active processing preparatory steps) are begun and completed during the time that each chamber 30,32 alternately and synchronously begins and completes active processing of its wafer (between the time the power supply is switched on and the time the power supply is switched off).

As described in greater detail below, the power supply, vacuum pump and throttle valve can all be shared by the dual chambers and used in alternation synchronously with the chambers 30,32 operations. Additionally, however, just as the aforesaid components may be shared, so too, can the other components of the system be shared, including, but not limited to, the end-point detector, the pressure transducers (manometers measuring pressures in the chambers), the gas box, the backfill pressure tank and lines, the reservoir and pressure equipment and lines and the like. Additionally, other configurations and sharing than those shown herein are possible.

2. The Power Supply

Plasma power sources come in many forms. In the preferred embodiment of the present invention microwave energy is used to excite the process gases at rarified pressures. However additional power supplies may be used in the present invention to produce a plasma condition. As a matter of practice, the FCC only allows certain frequencies to be used for high power non-communications commercial applications while the vast majority of the radio frequency spectrum is reserved for communications. Typically, the RF frequencies used in commercial semiconductor applications are 100 KHz, 400 KHz, 13.56 MHZ, 915 MHZ, and 2.45 GHZ. The bands above 900 MHZ are generally called microwave frequencies because of their very short wavelengths. But, in fact, they are all radio frequencies and it is the intent of the present invention to cover all applicable radio frequencies.

3. Robotic Interfaces

The robotic interface to the process reactors can also take on many forms. In one embodiment described in this patent application in working example 2 in FIGS. 19–20 a single arm, dual gripper is used (one arm linkage, but ability to hold two wafers at a time). The preferred robotic form is a dual arm robot, such as is described below in working example 3 (FIGS. 21–31), each with a single gripper to hold one wafer on each arm for an overall total of two wafers. A single arm linkage with one gripper to hold only one wafer ordinarily would be too slow for many applications, but may be acceptable for long processes.

The particular configuration used in this application has the cassettes and chambers on 90 degree X-Y coordinates which means that the robot moves in a straight line path perpendicular to a line joining a cassette on one side and a processing chamber on the other side, that is, in an aisle between the two cassettes on one gripper and the two chambers on the other gripper.

If a circular arrangement is used, then the traverser is not needed. In the circular arrangement, the robot is at the center and the cassettes and process reactors are on a fixed radius around it. Newer robots have additional degrees of movement freedom to operate with cassettes and process reactors on 90 degree X-Y configurations, yet are located at a central fixed position. It is the intent of this application to cover all robot types.

4. The Process Gas Flow

As best seen in the schematic diagram of FIG. 15, the process gases of the present invention are selected and then flow through a plurality of lines according to the position of a plurality of valves mounted on the process gas distribution box 20 and which are under the control of a computer program (not shown). While the gases and the distribution hardware 20 used in the present invention are all conventional, the system architecture and the software processes which control the flow of gases therethrough are proprietary.

Process gases originate from a common source for both processing chambers 30,32. However, the gas flow is alternately enabled through separate lines to each plasma applicator 26,28 and chamber 30,32 combination in synchronism with the loading of an unprocessed wafer therein by the robot 15, the application of a vacuum by the common pump 34 in the chamber 30,32, the heating of the wafer on the chuck 31,33, the switching on by the common microwave switch 24 of the common microwave power supply 22, the stabilization of the pressure in the chambers 30,32 by the throttle valves 36,37, the venting 41,43 of the chambers 30,32 and the removal of the processed wafers from the chambers 30,32 by the robot 15. As is well known in the trade, provision is made for brief slow pump bypassing of the throttle valves 36,37 by closing isolation valves 38,39, opening bypass valves 45, 47 and applying the vacuum 34 to the chambers 30,32 through the orifices 49,51. This step reduces the speed of adiabatic expansion and, consequently, the temperature drop in the chamber 70, 72. Initial fast pumping is not used because it creates condensation and particles.

5. The Pumping System

Figure 16:
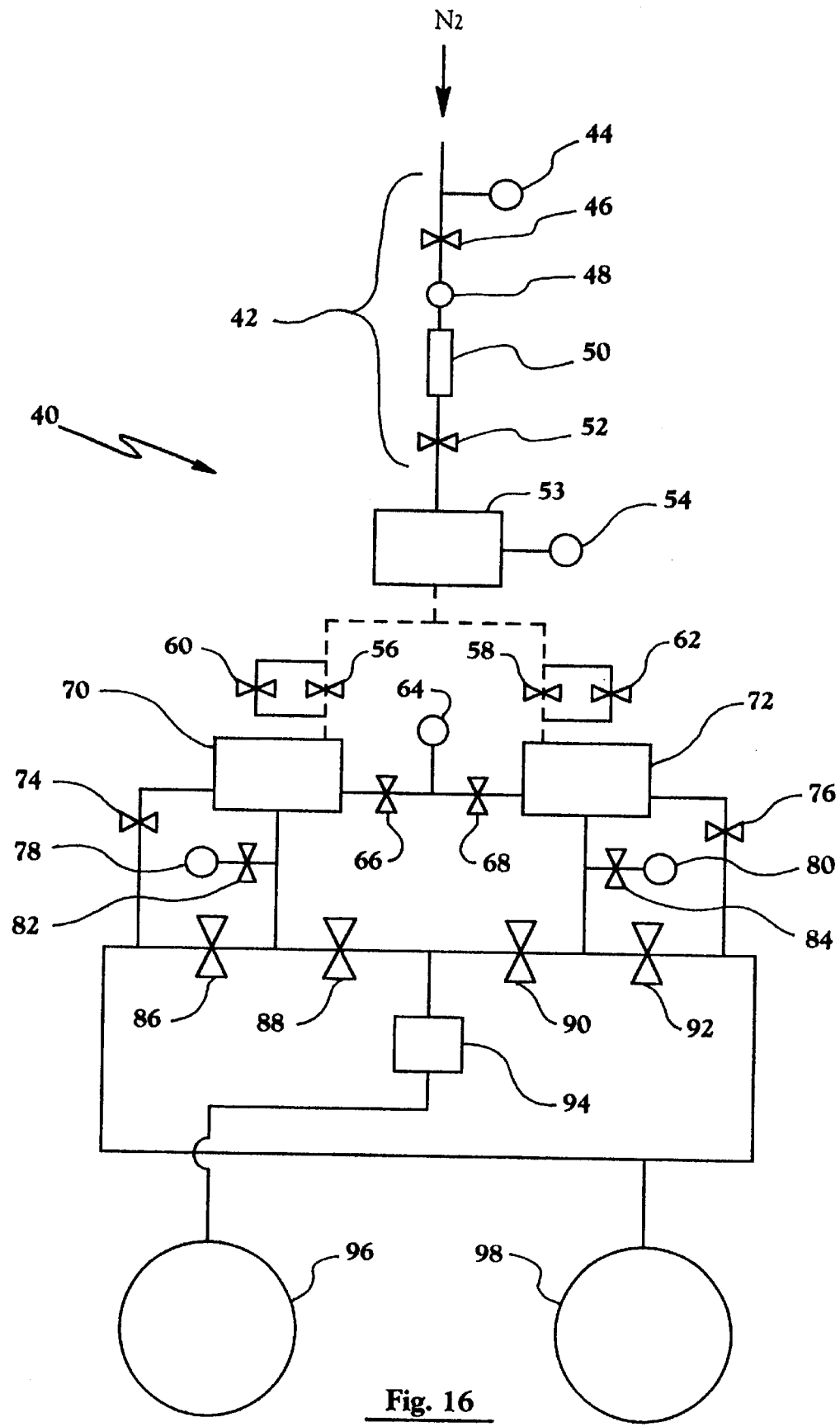
FIG. 16 is a detailed schematic diagram of the pump/vent system of a dual downstream reactor version of the present invention using dual vacuum pumps and a single throttle valve.

As best seen in FIG. 16, in one embodiment of the present invention the pumping system subsystem of the pump/vent system 40 includes two pumps 96,98 and one throttle valve 94 for the two process chambers 70,72. This architecture is based on the condition that only one of chambers 70,72 is running process at any one time. To pump down a chamber 70,72 the appropriate one of stop valves 86,92 is opened and wet pump 98 is operated. Manometer 64 indicates the pressure in the chamber 70,72 which is processing by opening the appropriate one of stop valves 66,68. To stabilize the operating chamber pressure the throttle valve will close correspondingly if the chamber pressure is too low, and, will open appropriately if the chamber pressure is too high.

The pump subsystem 96,98 provides the following additional significant operating features and advantages when compared to one vacuum pump for one processing chamber setup:

a. Dry/Wet Pump Setup Reduces Cost Without Sacrificing Performance.

In the embodiment of FIG. 16, one of the two pumps 96,98 is used solely for chamber pump-down while the other pump is used only during the processing of the wafer.

For pumping down a chamber 70, 72, wet pump 98 is operated and the appropriate one of the stop valves 86,92 is opened while its associated stop valve 88,90 is closed. Wet pump 98 requires oil for lubricating the pumping mechanism, and, therefore, it is highly possible that the chamber 70,72 may be contaminated by the lubrication oil due to back-streaming. However, oil back-streaming occurs in higher vacuum conditions where fewer gas molecules exist in the pump line, and the oil molecules require some time to travel back-stream to the chamber 70,72. During pump-down, the chamber pressure is reduced from 760 Torr to 1 Torr and a pump-down cycle is completed in 3 to 5 seconds. The higher pressure translates into a lot of gas molecules and creates a sweeping effect in a short period of time, virtually eliminating the back-streaming effect.

For the processing of the wafer, the dry pump 96 is operated with throttle valve 94 and the appropriate one of the stop valves 88,90 open and its associated pump down stop valve 86,92 closed. A dry pump 96 is preferable for the processing pump because it does not require lubrication oil for the pumping mechanism, and, therefore, eliminates the possibility of process contamination by oil back-streaming to the processing chamber 70,72 through the pump line. The dry pump 96 costs about twice as much as the wet pump 98. The dry/wet pumping system setup reduces the overall cost of the system and efficiently utilizes the function of the pumps 96,98.

b. Single Throttle Valve Further Reduces Cost

In the embodiment of FIG. 16, only one throttle valve 94 is necessary since only one of the chambers 70,72 is running a process at any one time. This setup configuration provides the capability of switching the throttle valve from servicing one chamber to the other by opening one of the stop valves 88,90, as desired, while closing the other one and also closing stop valves 86,92.

c. Less Process Variations Between Chambers

Because both chambers 70,72 share the same throttle valve 94 and processing pump 96, process variations from chamber to chamber are significantly reduced.

d. Bypassing the Throttle Valve For Pump-Down Reduces Overall Process Time

If pump-down is conducted through the throttle valve 94, the throttle valve 94 has to be wide open for a faster pump-down. When the chamber 70, 72 reaches the base pressure, the throttle valve 94 starts to move to the throttling position while process gas starts to flow. It usually takes the throttle valve 94 about 5 seconds to control the chamber to reach the desired process pressure. Nearly this entire 5 seconds can be saved by bypassing the throttle valve 94 for pump-down, since the throttle valve can be preset at the desired position for a faster process pressure stabilization.

6. The Venting System

As best seen in FIG. 16, in one embodiment of the present invention the venting subsystem of the pump/vent system 40 includes a source of $N_2$ gas which enters the system through a conventional gas box 42 having a pressure gauge 44, a stop valve 46, a pressure regulator 48 which is adjustable in a range, for example between 0–100 psig, a filter 50, and a stop valve 52. The gas box 42 distributes the N2 gas to a pressurized back-fill tank 53 and then to chamber 70 through a pair of parallel valves 56,60 and to chamber 72 through a pair of parallel valves 58,62. The miniconvectorns 78,80 measure the pressure in the chambers 70,72 through valves 82,84 in a broad range from the base vacuum of a few mTorr to atmospheric level of 760 Torr. The vent subsystem provides the following additional operating features and advantages:

a. Initial Slow Venting Particle Contamination

Upon completion of the processing in a chamber 70,72, initial slow venting is achieved by opening the appropriate one of the small orifice (0.25 inches) valves 60,62.

b. Fast Venting by the Pressurized Back-Fill Tank.

The short initial slow venting step described in the preceding section is immediately followed by a fast venting which is achieved by shutting the small orifice valves 60,62 and opening the appropriate one of the large orifice valves 56,58 backfilling the chamber with N2 from the pressurized back-fill tank 53 which is kept at a preferred pressure of 30 psig on pressure gauge 54.

c. The Pressurized Back-Fill Tank Reduces The Pressure Drop In The N2 Line

Venting requires a lot of N2. Without a pressurized tank 53, if chamber 1 were venting while chamber 2 was running a process, the N2 pressure in the gas line to chamber 2 might drop, and, if it did, the process gas flow of chamber 2 might be disrupted. Pressurized back-fill tank 53 is equivalent to the capacitor of an electrical circuit where energy can be stored and released in a short period of time thereby minimizing process disruption.

d. Continuous Purge Prevents Moisture From Entering the Chamber.

Moisture is the root cause of corrosion. When a chamber 70,72 has been vented to atmospheric pressure by opening the gate valve 41,43 (FIG. 15) and the robot 15 is transferring wafers in and out of the chamber 70,72, the venting subsystem of the pump/vent system 40 can provide a gentle trickle purge of N2 gas through the bleed valve 60,62 (FIG. 16) to keep air and moisture from entering the chamber 70,72.

7. The Vacuum Reservoir Equivalent

One need not be concerned about connecting both chambers to a single vacuum pump out of fear of interaction when one chamber is processing a wafer and the other chamber begins to pump down from atmosphere, expecting that the burst of air could potentially travel down the vacuum line to the pump and back up to the chamber processing the wafer. The most negative pressure is going to be at the pump head. If the vacuum lines are long enough and big enough in diameter, the pressure will equalize and expand to fill the space. By the time that the side that is pumping down reaches the pump, the pressure will be very low. Meanwhile on the side where the wafer is being processed, process gas is being delivered through the mass flow controllers. In the case of ashing, the total process gas flow is on the order of 5 liters per minute. Therefore, the gas going through the chamber being processed should be at a higher pressure than what is in the line. The key to this working is sufficiently long vacuum lines to provide isolation between the two process chambers. To assist in isolation the vacuum lines should be fairly large in diameter to provide more volume for the air to expand from the chamber being pumped down. Furthermore, a bypass valve is provided with a ¼ inch line to slow the initial burst of air from the chamber being pumped down. A second or two later, the main ISO 80 valve is opened providing a higher conductance to rapidly pump the remaining air from the chamber.

8. The End-point Detector

The fiber optic cable transmits UV light from the chamber being processed. Again, since only one chamber at a time is processing a wafer, the two fiber optic cables go into an optical summing junction where the signals from the two chambers are added together. Obviously, only one produces UV light at a time, so an optical switch is unnecessary. The end point detector is a monochromator which selects only one spectrum emission line, typically an OH line. End-point detectors are relatively expensive. Normally, one end-point detector is required per chamber.

10. Working Example 1

As seen in FIGS. 17–18, the line graph displays a task function along the Y coordinate and time along the X coordinate of a complete cycle of a first working example of one embodiment of the present invention in which two conventional downstream reactors each running the same or similar process are serviced by two exterior (relative to the vacuum) 25-wafer cassettes and a single exterior robot with one front arm and one rear arm. The same sequence would be followed using a single 25-wafer cassette.

Actually, the process reactors can be different and still alternate overhead/process tasks. Wafers would be mapped cassette #1 to process chamber #1 and cassette #2 to process chamber #2.

As seen in FIG. 17, and as more generally disclosed above, the process cycle can be best explained by examining the movements of the robot 15 which are traced out schematically in FIG. 18. Starting at the top function of FIG. 17 at chamber 1 at the point in the cycle where chamber 1 has been backfilled to atmospheric pressure, its pins raised and the chamber 1 door opened, the robot 15 removes a previously processed wafer 1 from chamber 1 with his back gripper and rotates 180 degrees placing an unprocessed wafer 3 previously removed from cassette 1 (one or two cassettes may be used) with its front gripper. The chamber 1 door is then closed its pins are lowered, a vacuum 34 is applied to the chuck 31, the chamber 1 is pumped down, the process gas is turned on, the process gas is stabilized by adjusting the throttle valve 36 (or 94 in a single pump process (FIG. 16)), and the active wafer 3 processing begins by igniting the plasma 26 for chamber 1 by switching 24 on the common microwave energy generator source 22 to it. Meanwhile from the point that the robot places the new wafer 3 into the chamber 1 for processing and thereafter while wafer 3 is being processed in chamber 1, the robot traverses to cassette 2 and holds the still hot processed wafer 1 at the cooling station which is actually a heatsink area on the robot's body combined with cool air from blower 35 (FIG. 15) directed at the robot. The robot then loads wafer 1 into the cassette 2 with its rear gripper, retracts and indexes to a new slot and removes unprocessed wafer 4 with the rear arm, and waits for the door to open of the now vented chamber 2 which has just finished processing a wafer 2 also previously deposited in it. The robot 15 removes the processed wafer 2 from chamber 2 with its front gripper, rotates 180 degrees, places the unprocessed wafer 4 into chamber 2 with its rear gripper, traverses to cassette 1 while the still hot processed wafer 2 is cooled and loads wafer 2 into the cassette 1, retracts and indexes and removes unprocessed wafer 5 and waits for the door to open to the now vented chamber 1 which has just finished processing the first wafer 3. The cycle repeats.

The overhead is near zero if each chamber 1,2 alternately and synchronously finishes processing its wafer just as the robot 15, finishes removing a fresh wafer from the cassette adjacent that chamber 1,2 with its one gripper ready for an exchange with its other gripper and the chamber overhead is shorter than the process time. In other words if the wait time is zero, then the overhead is near zero and 100% utilization of the processing capacity of the machine is being realized. Achieving near zero wait time is simply a function of doing what is necessary to shorten and equalize the processing times in the adjacent chambers while speeding up the robot to finish his tasks in the same or similar amount of time.

In working example 1 both cassettes are processing simultaneously, and all of the wafers are removed from one cassette before processing, but, are returned to the other cassette after processing.

11. Working Example 2

Figure 19:
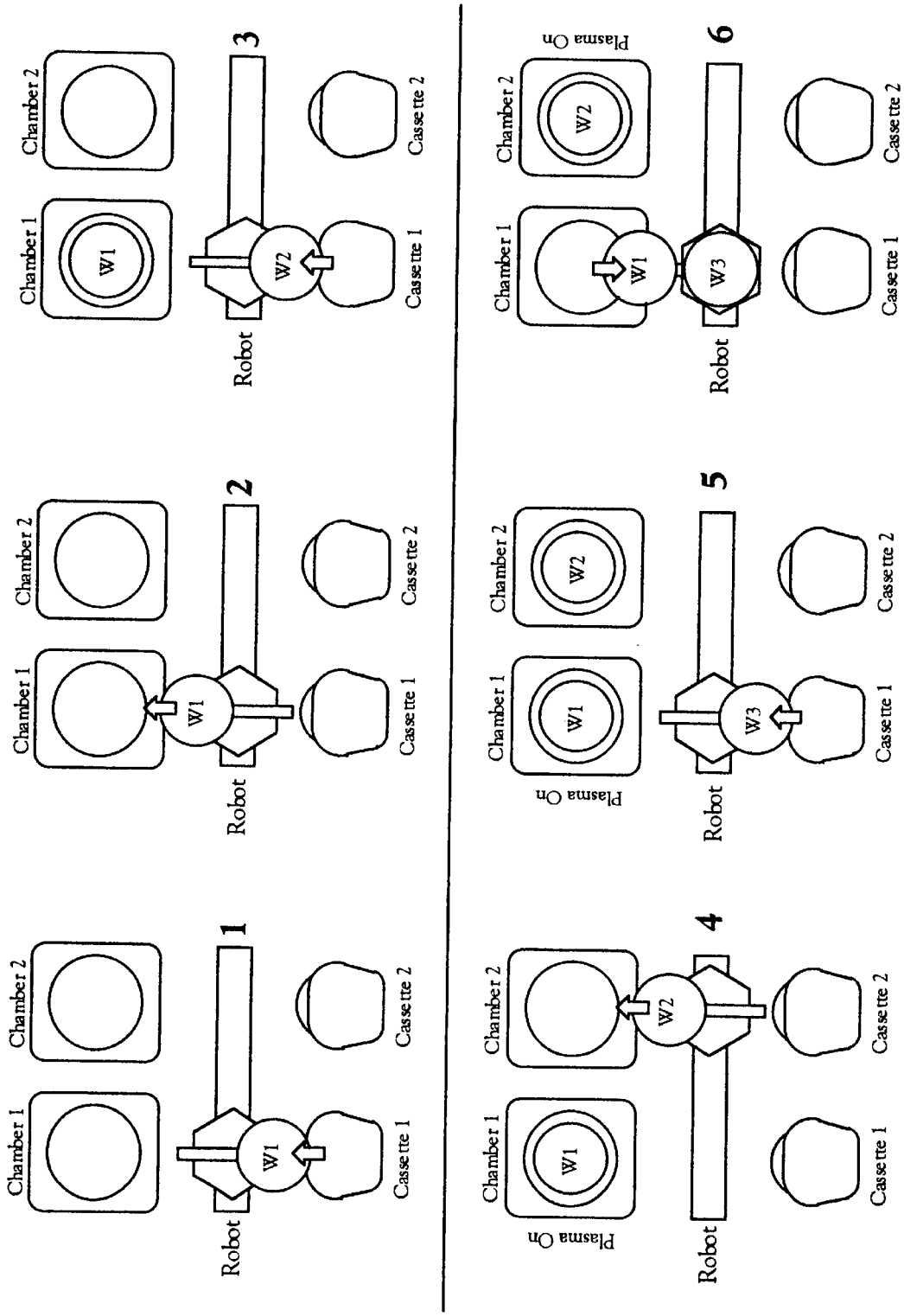
FIGS. 19–20 are schematic representations showing the robot movements of a modified form of the present invention in a second working example in FIG. 17 in which the robot may be viewed as always standing with one arm on one side adjacent the chamber and the other arm on the other side adjacent the cassette and shuttling the wafers from one arm to the other to accomplish the specified function.
Figure 20:
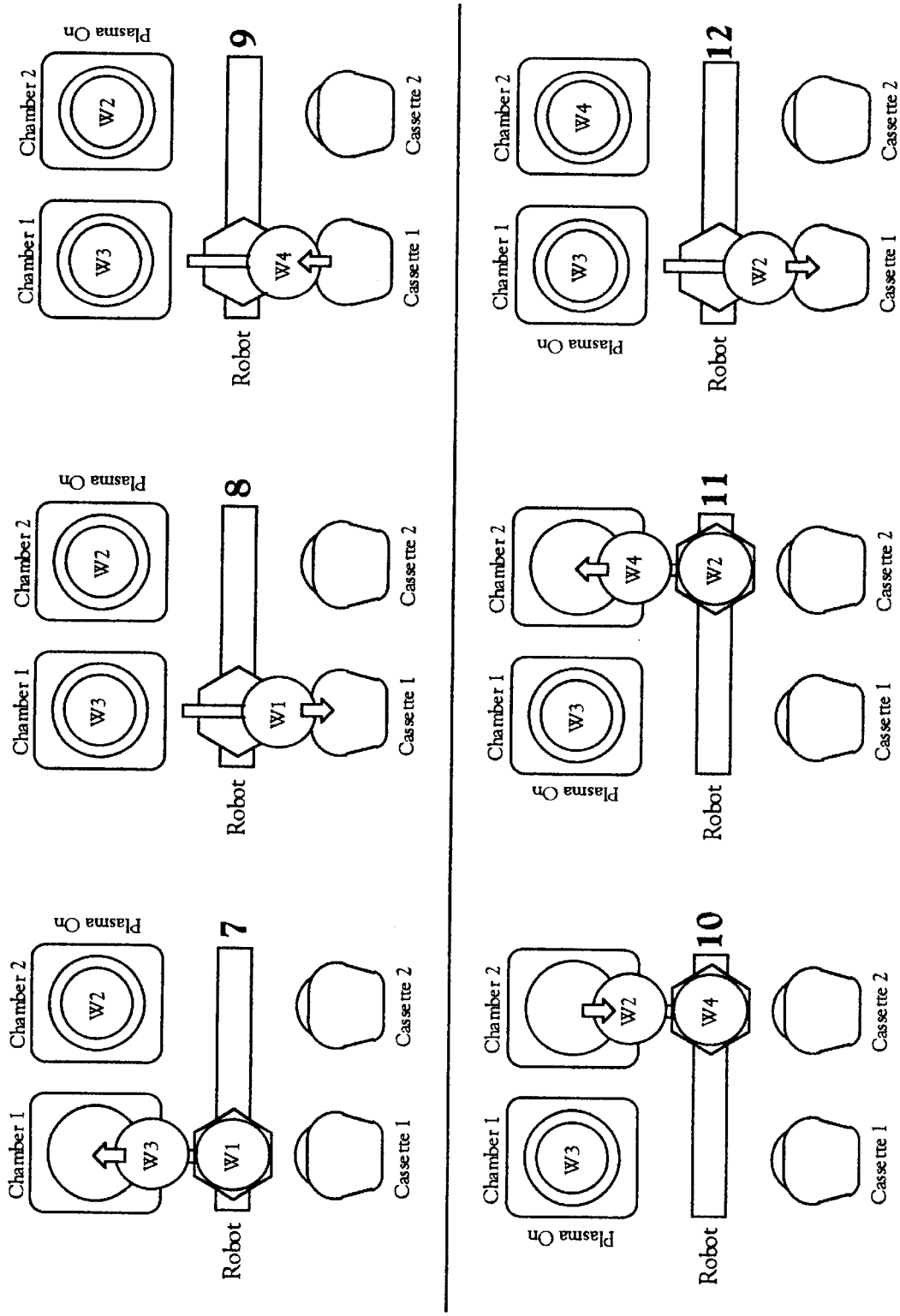
Figure 22:
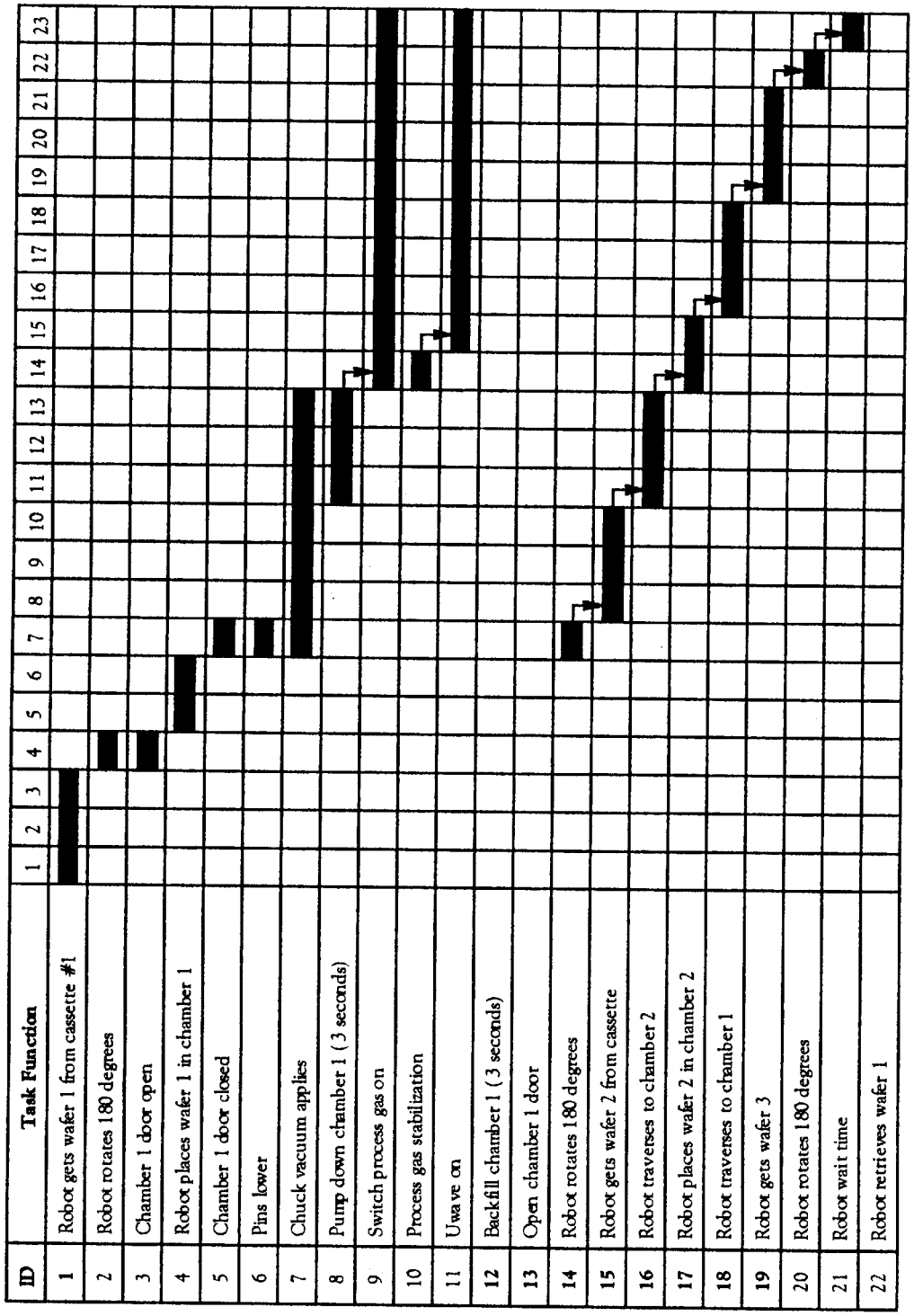
FIG. 22 is a line graph of a detailed task function timing diagram of a first portion of a second working example of a dual, same single process, downstream reactors version of the present invention using a single exterior (relative to the vacuum) 25-wafer cassette and a single exterior robot with two front (left and right) arms which is completely shown in FIG. 30.
Figure 25:
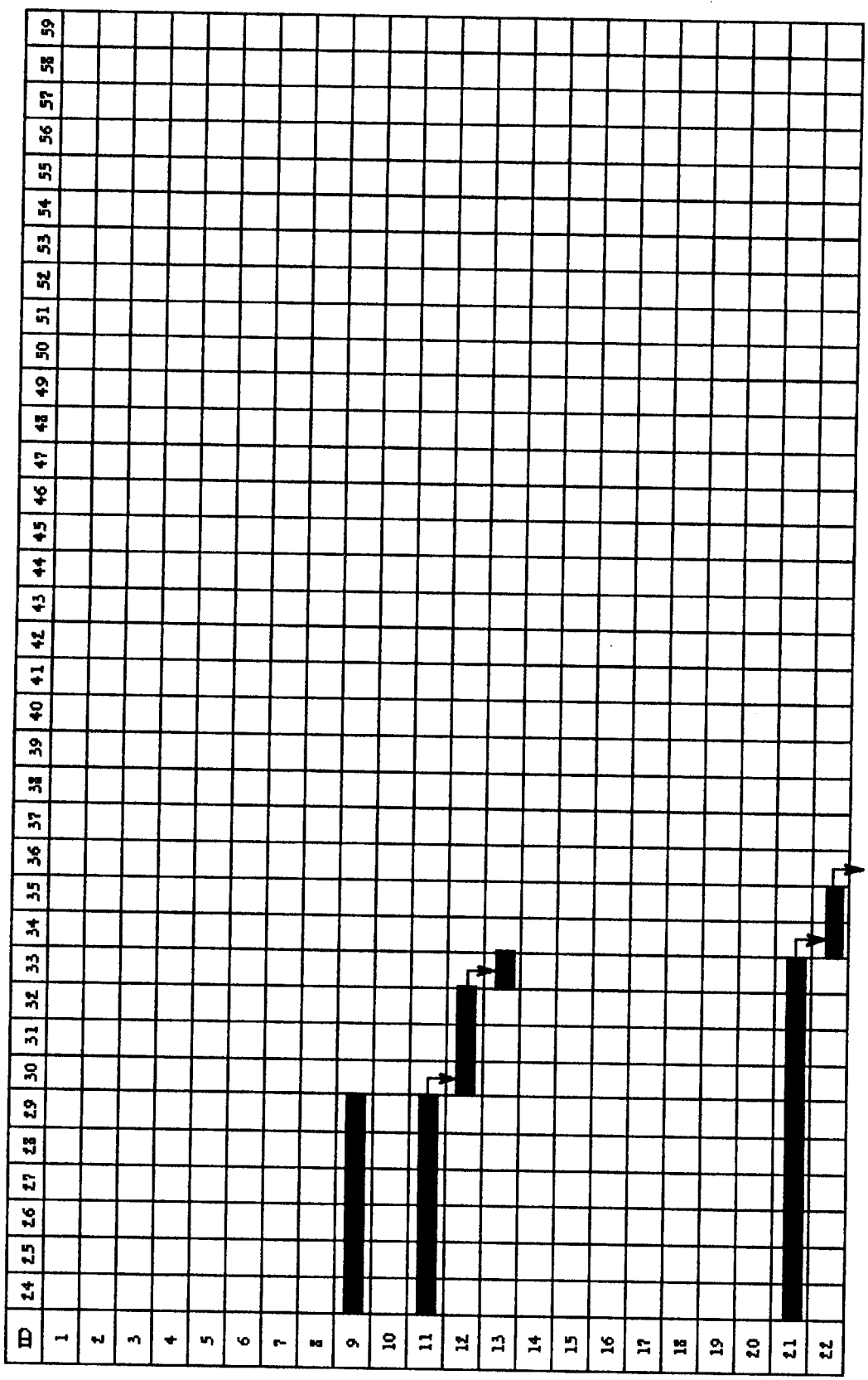
FIG. 25 is a line graph of a detailed task function timing diagram of a fourth portion of the working example of FIG. 30.
Figure 26:
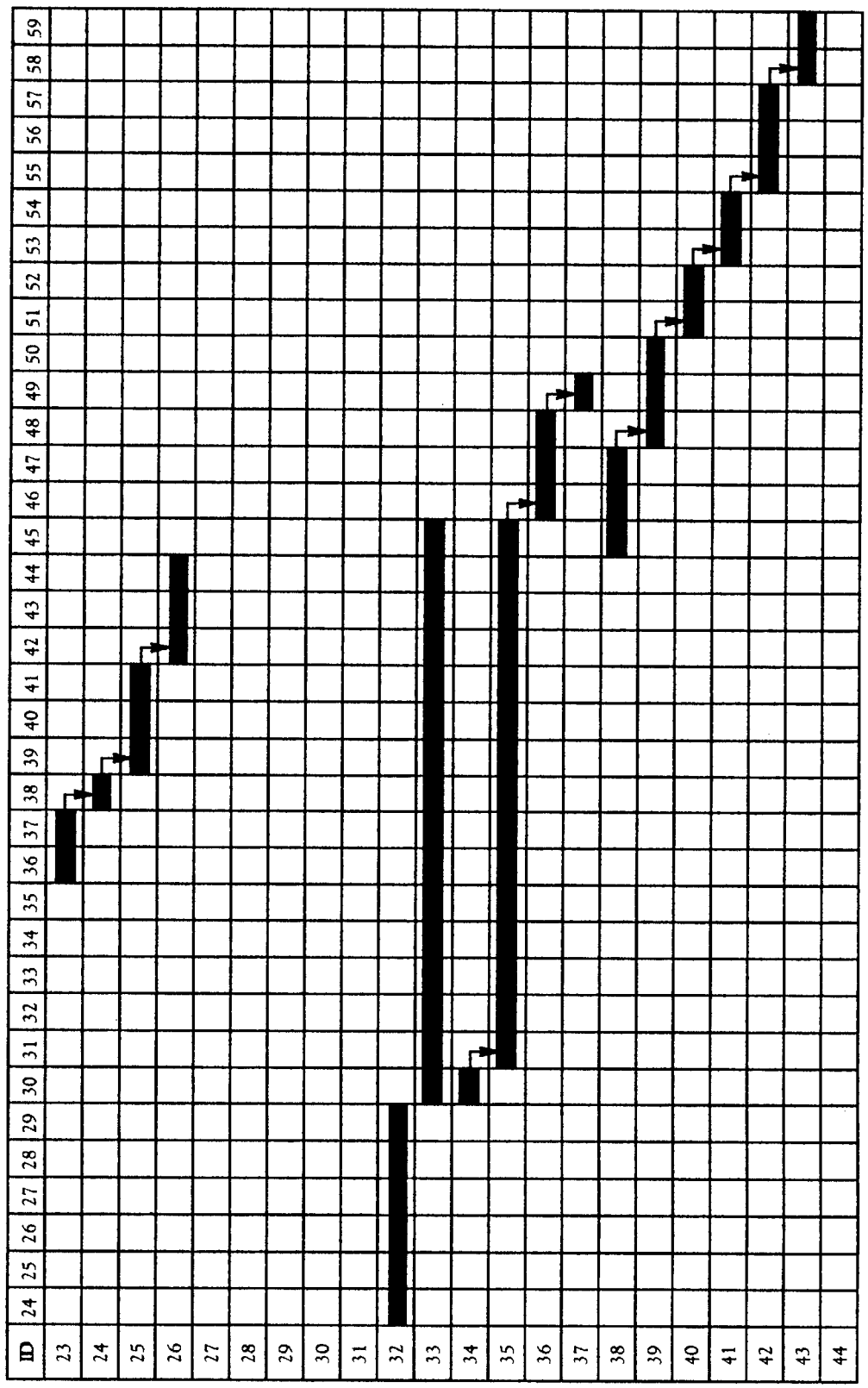
FIG. 26 is a line graph of a detailed task function timing diagram of a fifth portion of the working example of FIG. 30.
Figure 27:
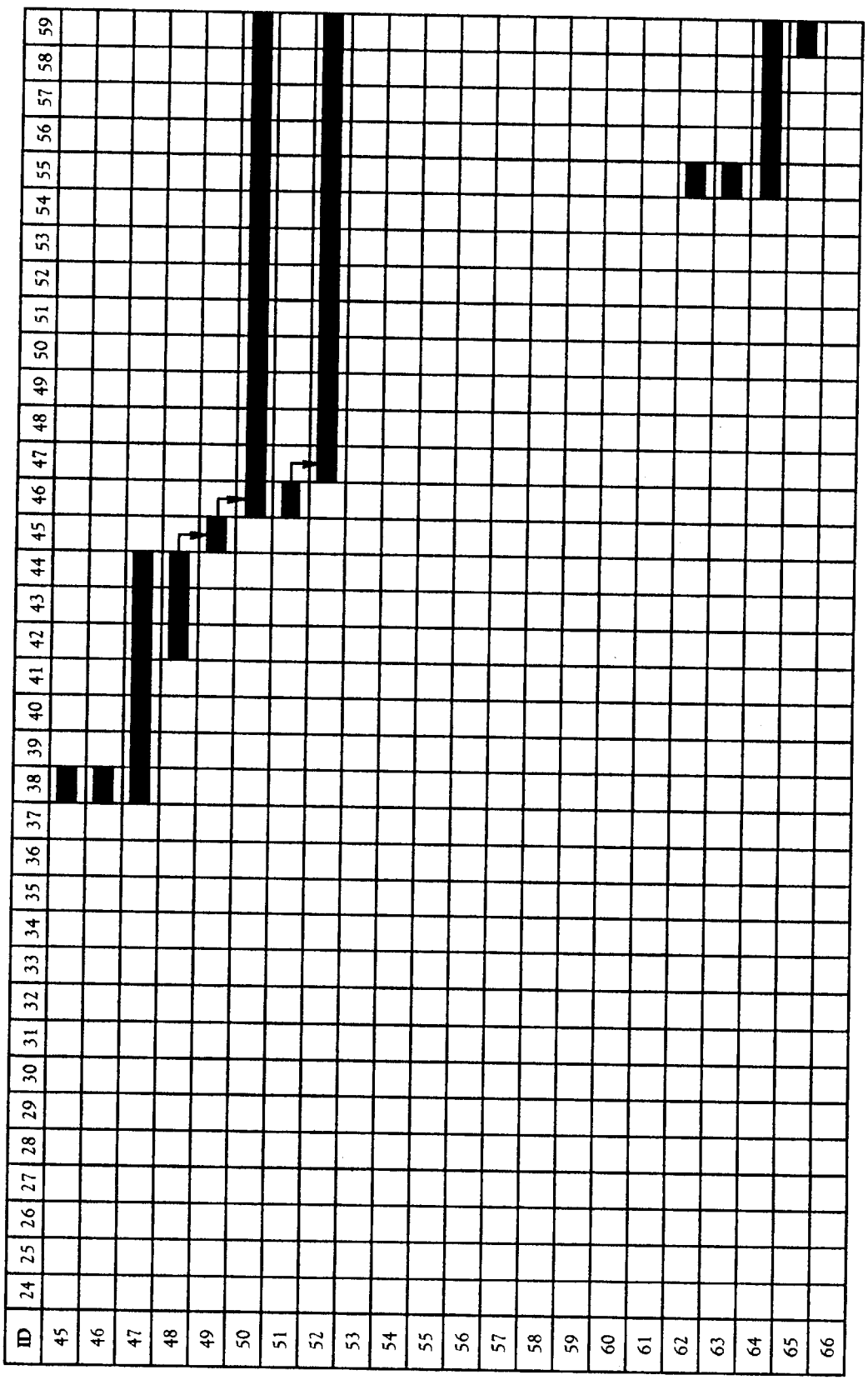
FIG. 27 is a line graph of a detailed task function timing diagram of a sixth portion of the working example of FIG. 30.
Figure 29:
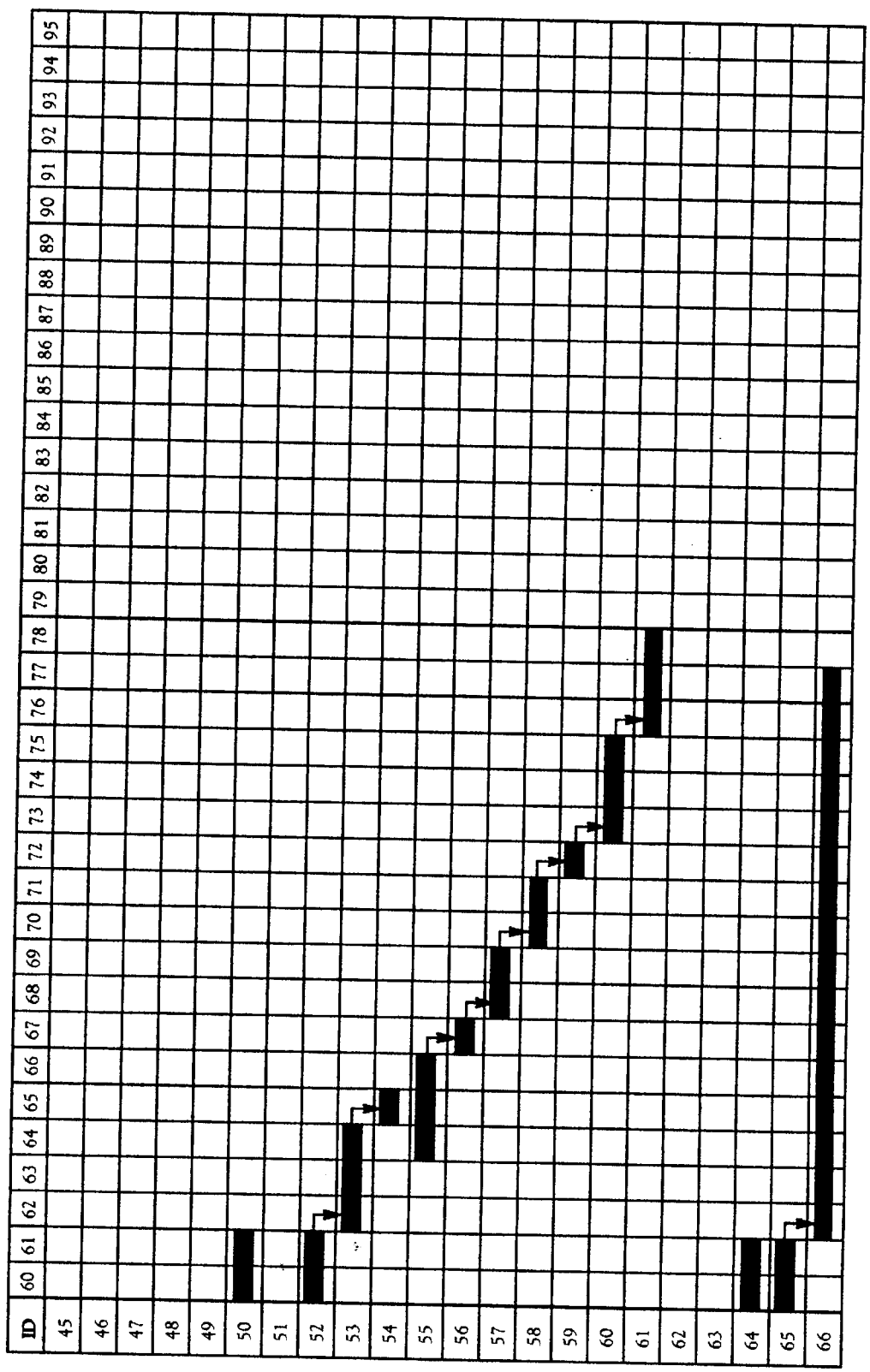
FIG. 29 is a line graph of a detailed task function timing diagram of a eighth portion of the working example of FIG. 30.

As seen schematically in FIGS. 19–20 the robot movements are those of a modified form of the working example of FIG. 17 but still similar in many respects. In FIGS. 19–20 the robot may be viewed as always standing facing toward chamber 2 and cassette 2 as seen in FIG. 19 step #1 with his left arm adjacent chamber 1 and the right arm adjacent cassette 1 and not turning 180 degrees to move a wafer from a cassette to a chamber, and, vice versa. In all other respects working examples 1 and 2 are identical.

Thus, as seen sequentially in FIGS. 19,20, wafer 1 is removed from cassette 1 (#1) and placed in chamber 1 for processing (#2); wafer 2 is removed from cassette 1 (#3) and placed in chamber 2 for processing (#4); wafer 3 is removed from cassette 1 (#5) and, as chamber 1 finishes processing, wafer 1 is removed from chamber 1 (#6) and replaced by wafer 3 (#7), and wafer 1 is stored in its original slot in cassette 1 (#8); wafer 4 is removed from cassette 1 (#9) and, as chamber 2 finishes processing, wafer 2 is removed from chamber 2 (#10) and replaced by wafer 4 (#11), and wafer 2 is stored in its original slot in cassette 1 (#12). The cycle repeats.

Note that in this example, even though two cassettes are used, all of the wafers are taken from only one cassette and all wafers are returned to their original slot in the same cassette before wafers in the other cassette begin processing. This procedure is typical because human or robot operators in the plant typically only come by every 10 to 15 minutes or so to change cassettes which allows continuous use of the machine, whereas in working example 1 both cassettes were processing simultaneously and all of the wafers are removed from one cassette before processing but are returned to the other cassette after processing.

12. Working Example 3

Figure 30:
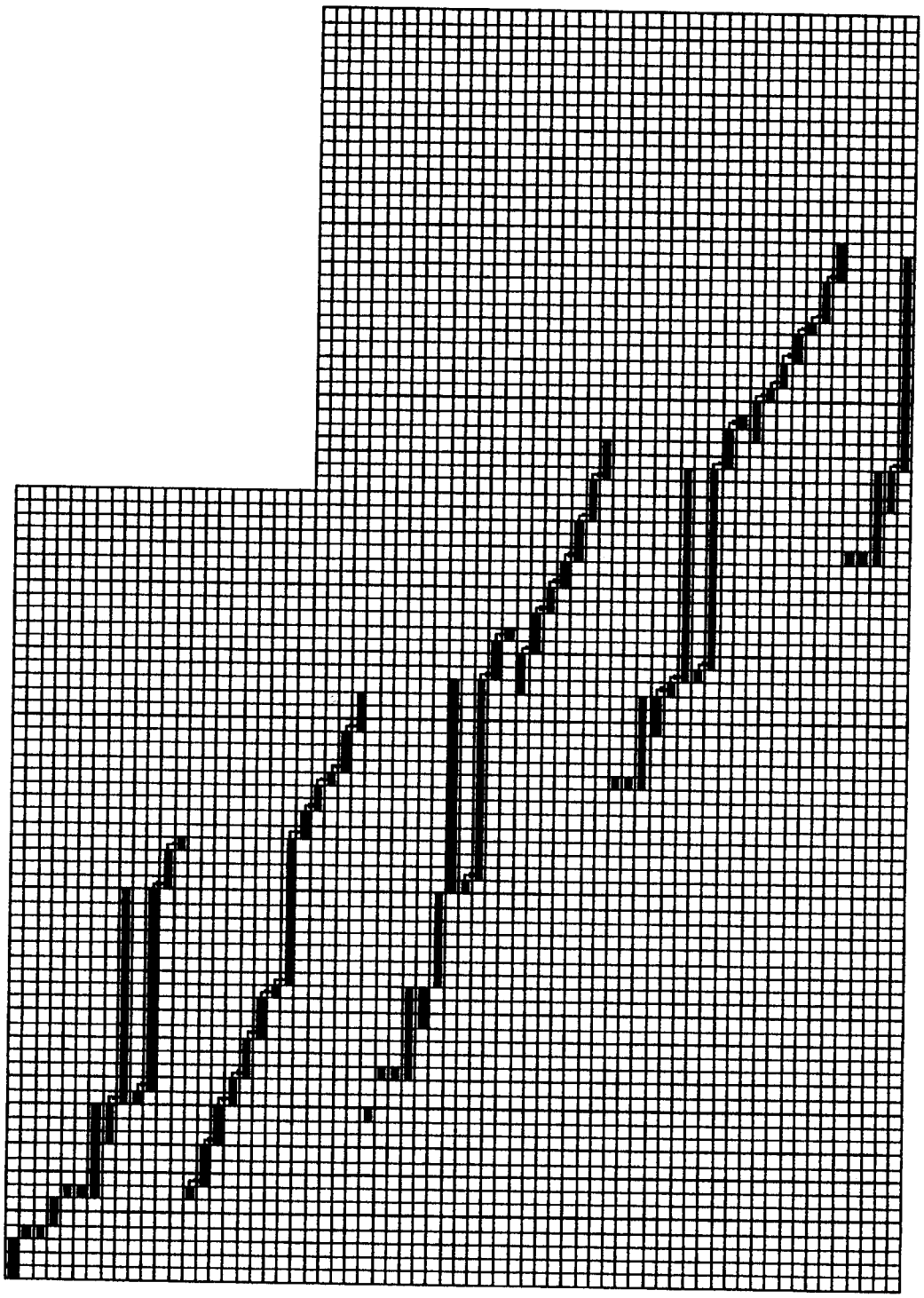
FIG. 30 is a line graph of the complete detailed task function timing diagram of a second working example of a dual, same single process, downstream reactors version of the present invention using a single exterior (relative to the vacuum) 25-wafer cassette and a single exterior robot with two front (left and right) arms, eight separate portions of which are shown enlarged in FIGS. 22–29.
Figure 31:
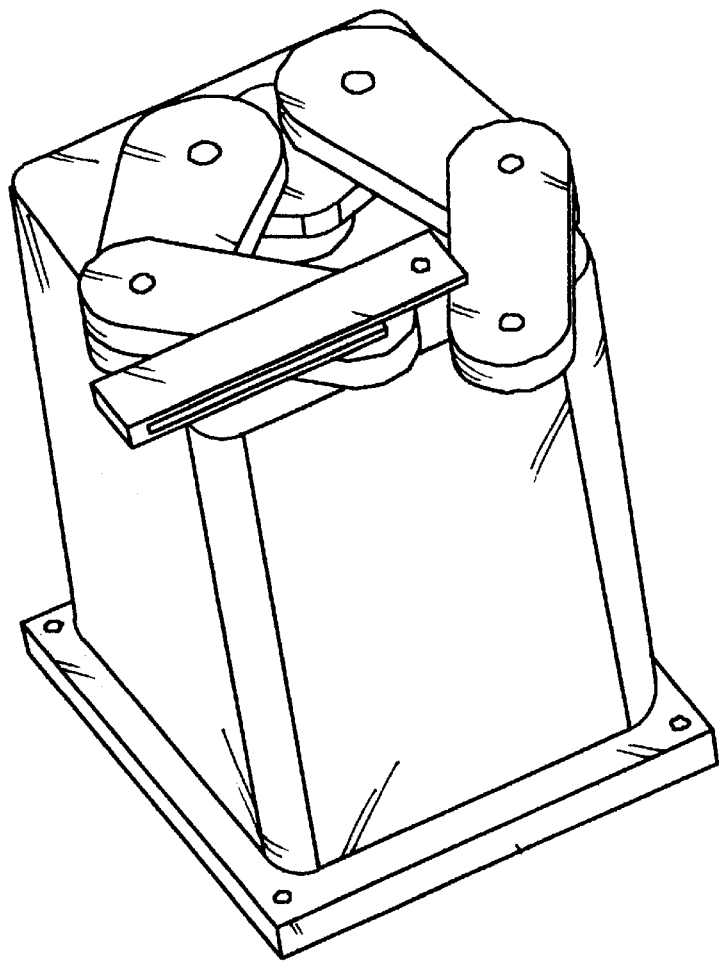
FIG. 31 is an enlarged perspective view of the dual armed robot used in the working example 3 of FIGS. 21–30 of the present invention.

As seen in FIG. 30 the movements are those of a robot of a third working example of an embodiment of the present invention in which dual downstream or in-chamber reactors are each running the same single process using a single exterior (relative to the vacuum) 25-wafer cassette and a single exterior robot with two front arms (as was the robot of working example 2 in FIGS. 19–20), eight separate portions of which are shown enlarged in FIGS. 22–29 for ease in reading the function steps. In this working example, all of the odd numbered wafers are processed in chamber 1 and all of the even numbered wafers are processed in chamber 2, but all wafers are returned to their original slots in the single cassette. Otherwise, the process steps are the same as in the prior working examples. Microwave energy is used in this example. Additionally, while the sequence is shown for a single cassette, actually the sequence can repeat relative to a cassette #2, #3, and #4, or even for 6 or more cassettes if desired.

10. Working Example Parameters

Figure 32:
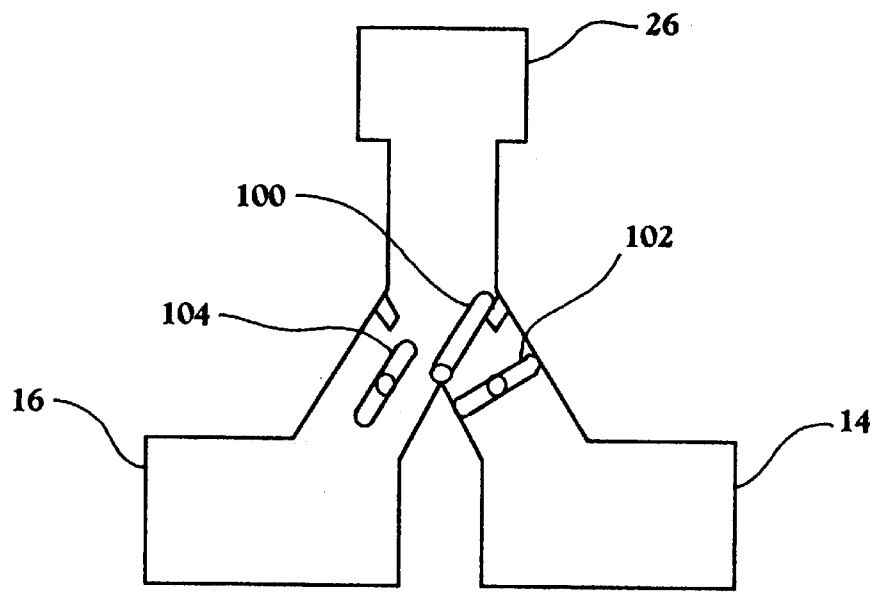
FIG. 32 is a schematic plan view of a single plasma applicator alternately servicing dual processing chambers using a common diverter plate.

A set of specifications of the typical process results and typical operating parameters of the present invention are as follows:

Microwave frequency: 2,450 MHZ
Microwave power: 1,000 watts
Operating Pressure: 1.2 Torr
Total flow rate: 4,400 sccm
 $O_2$ 4,000 sccm
 $N_2$ 400 sccm 11. Additional Embodiments The present invention may still take further forms. For example, as seen in FIG. 32 further economies and reductions in overall cost may be achieved by using a single common plasma applicator 26 the output flow of plasma excited process gases from which are selectively directed alternately 100 to one of a pair of separate processing chambers 14,16. In this embodiment, not shown, while the plasma exhaust will be extremely hot, nonetheless, materials exist which could withstand this intense heat blast and not contaminate the downstream plasma excited process gases flow. In this embodiment there is a contemporaneous requirement for sealing off 102,104 the path to the non-processing process chamber to preserve vacuum integrity. From such heat resistant materials referenced above, a common diverter plate 100 is constructed and is mounted adjacent the plasma exhaust and is mechanically or electro-mechanically operated to alternately deflect the plasma exhaust in one path through an open very large orifice stop valve 104 to and in synchronism with the processing one of the two processing chambers while a very large orifice stop valve 102 is synchronously closed in the other path to the non-processing chamber, and vice versa. The complete elimination of one entire plasma applicator further eliminates a costly redundancy and is in keeping with the objects of the present invention.

The foregoing description of a preferred embodiment and best mode of the invention known to applicant at the time of filing the application has been presented for the purposes of illustration and description. It is not intended to be exhaustive or to limit the invention to the precise form disclosed, and obviously many modifications and variations are possible in the light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A dual chamber apparatus for continuously processing a plurality of workpieces comprising:
    a common power source switchable between a first chamber and a second chamber,
    the first chamber for processing a second workpiece in a deep vacuum to completion therein when the power source is applied thereto and switched ON,
    a robot for removing at substantially atmospheric pressure a first workpiece from the second chamber after processing and reloading the second chamber with a third workpiece to be processed while the second workpiece is being processed in the first chamber,
    the second chamber for processing the third workpiece in a deep vacuum to completion therein when the power source is applied thereto and switched ON,
    the robot for removing at substantially atmospheric pressure the second workpiece from the first chamber after processing and reloading the first chamber with a fourth workpiece to be processed while the third workpiece is being processed in the second chamber, and
    a computer for repeatedly synchronously alternately controlling the power source application, the robot movement and the chamber processing as aforesaid.

2. The apparatus of claim 1 wherein the chambers are adjacent to each other.

3. The apparatus of claim 1 wherein the power supply is microwave.

4. The apparatus of claim 1 wherein the power supply is a common radio frequency power source synchronously multiplexed between the pair of processing chambers.

5. The apparatus of claim 1 wherein each workpiece is a silicon wafer and the processing chambers are each configured to receive a single silicon wafer at a time, and the processing chambers each comprise a downstream plasma reactor.

6. The apparatus of claim 1 wherein each workpiece is a silicon wafer and the processing chambers are each configured to receive a single silicon wafer at a time, and the processing chambers each comprise an in-chamber plasma reactor.

7. The apparatus of claim 1 wherein the computer is programmed such that chamber overhead time substantially does not overlap with the chamber processing time.

8. The apparatus of claim 1 further comprising:
    the robot having two grippers and alternately and synchronously finishes removing a fresh workpiece from a cassette with it one gripper ready for an exchange with it other gripper adjacent a chamber in which one of the workpieces has just finished processing and the chamber overhead is shorter than the process time.

9. The apparatus of claim 8 wherein the computer is programmed to have a robot wait time of substantially zero between loading an unprocessed workpiece in one of the chambers and unloading a processed workpiece in the other of the chambers.

10. The apparatus of claim 8 wherein the computer is programmed to have a robot wait time of near zero between loading an unprocessed workpiece in one of the chambers and unloading a processed workpiece in the other of the chambers.

11. The apparatus of claim 1 further comprising:
    two cassettes supported adjacent the chambers wherein all of the workpieces are alternately and synchronously removed from one cassette before processing and are returned to the other cassette after processing.

12. The apparatus of claim 1 further comprising:
    two cassettes supported adjacent the chambers wherein all of the workpieces are alternately and synchronously removed from one cassette before processing and are returned to their original slot in the same cassette after processing before any workpieces in the other cassette begin processing.

13. The apparatus of claim 1 wherein a cassette is supported adjacent the chambers and the computer is programmed such that, alternately and synchronously, all of the odd numbered workpieces are processed in the second chamber and all of the even numbered workpieces are processed in the first chamber, but all workpieces are returned to their original slots in the single cassette.

14. The apparatus of claim 1 further comprising:
a dedicated chamber process gas vacuum pump coupled to a throttle valve during processing of a workpiece for stabilizing a chamber operating pressure, and
a dedicated chamber pump-down vacuum pump bypassing the throttle valve during chamber pump-down.

15. The apparatus of claim 1 further comprising;
a vent line for venting one chamber to atmosphere without disturbing the process gas flow in the other chamber.

16. The apparatus of claim 15 wherein the vent line further comprises:
a first vent line for initially slow venting the one chamber, and
a second vent line for fast venting that chamber immediately thereafter.

17. The apparatus of claim 16 wherein the first vent line further comprises a small orifice valve, and wherein the second vent line further comprises a large orifice valve, and further comprising a pressurized back-fill tank coupled to the vent lines for backfilling the chamber with a gas therefrom.

18. The apparatus of claim 1 further comprising:
a gas line coupled to each chamber through which a gas is trickle purged for preventing air and moisture from entering a chamber while the chamber is vented to atmosphere.

19. The apparatus of claim 1 wherein the vacuum lines further comprise:
a vacuum reservoir equivalent which prevents interaction between the chambers by isolating one chamber from the other when connecting both chambers to a single vacuum pump.

20. The apparatus of claim 19 wherein the vacuum reservoir equivalent comprises a volume sufficient to preventing a burst of air upon venting one chamber from traveling down a vacuum line to the vacuum pump and back up another line to the chamber processing the workpiece.

21. The apparatus of claim 20 wherein the vacuum reservoir equivalent further comprises:
vacuum lines which are long enough and big enough in diameter so that the air burst pressure wil equalize and expand to fill the space and will be very low by the time it reaches the pump in the line on the side that is pumping down.

22. The apparatus of claim 20 wherein the vacuum reservoir equivalent further comprises
a small orifice valve for slowing the initial burst of air from the chamber being pumped down by initially passing the air burst therethrough, and
a large orifice valve for providing a higher conductance to rapidly pump the remaining air from the chamber by passing the air burst therethrough a second or two thereafter.

23. The apparatus of claim 1 further comprising:
a fiber optic line, through which light emissions generated by the process is transmitted, coupled between each chamber and a monochromator which receives the light for detecting the end point of the process.

24. The apparatus of claim 23 further comprising:
the fiber optic line from each chamber coupled to a switchless optical junction wherein the signals from the two chambers are summed as the light emissions from each chamber, which occurs only while a respective one of the chambers is processing, is passed therethrough.

25. The apparatus of claim 1 wherein the power source and dual chambers are constructed and configured into a single first state processor and dual second stage processor further comprising:
the first stage supported adjacent the dual chambers of the second stage and having an output coupled to a first path coupled to one of the chambers and a second path coupled to the other chamber and selectively directable to either one of the paths,
a valve in each path for selectively opening and closing each path,
wherein when the output of the first stage is directed to the first path the second path is closed, and the second workpiece is processing in the first chamber to completion while the first workpiece is simultaneously removed after processing from the second chamber and replaced with the third workpiece to be processed, and
wherein when the output of the first stage is directed to the second path the first path is closed, and the third workpiece is processing in the second chamber to completion while the second workpiece is simultaneously removed from the first chamber and replaced with the fourth workpiece to be processed.

26. The apparatus of claim 25 further comprising a single plasma applicator selectively communicating plasma excited process gases to either the first path or the second path.

27. The apparatus of claim 26 further comprising:
a common diverter plate mounted adjacent the output for alternately blocking the output into the path of one of the pair of processing chambers.

28. The apparatus of claim 1 wherein each workpiece is a cassette containing multiple substrates and the robot is configured to transfer the cassette into one of the chambers, and each of the chambers is configured to receive and process a cassette of substrates.

* * * * *

UNITED STATES PATENT AND TRADEMARK OFFICE
CERTIFICATE OF CORRECTION

PATENT NO. : 6,273,956 B1
DATED : August 14, 2001
INVENTOR(S) : Cox

It is certified that error appears in the above-identified patent and that said Letters Patent is hereby corrected as shown below:

<u>Title page,</u>
Item [63], insert -- Division of application No. 09/060,095, filed on April 14, 1998, now Pat. No. 6,228,773. --

<u>Column 1,</u>
Line 4, insert -- This application is a divisional of application number 09/060,095 filed on April 14, 1998, now U.S. Patent No. 6,228,773. --

Signed and Sealed this

Twenty-second Day of October, 2002

*Attest:*

*Attesting Officer*

JAMES E. ROGAN
*Director of the United States Patent and Trademark Office*